United States Patent
Zhu

(10) Patent No.: US 9,882,530 B2
(45) Date of Patent: Jan. 30, 2018

(54) RECEIVER AND SIGNAL PROCESSING METHOD

(71) Applicant: Huawei Technologies Co., Ltd., Shenzhen (CN)

(72) Inventor: Hufei Zhu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/417,019

(22) Filed: Jan. 26, 2017

(65) Prior Publication Data

US 2017/0141731 A1    May 18, 2017

Related U.S. Application Data

(63) Continuation of application No. PCT/CN2014/083239, filed on Jul. 29, 2014.

(51) Int. Cl.
*H04B 1/26* (2006.01)
*H03D 7/16* (2006.01)
*H03M 1/12* (2006.01)

(52) U.S. Cl.
CPC .......... *H03D 7/165* (2013.01); *H03M 1/1245* (2013.01)

(58) Field of Classification Search
None
See application file for complete search history.

(56) References Cited

U.S. PATENT DOCUMENTS

| | | | |
|---|---|---|---|
| 6,393,070 B1 | 5/2002 | Reber | |
| 7,616,678 B2 * | 11/2009 | Cangiani | H04L 5/026 370/335 |
| 8,320,858 B2 * | 11/2012 | Ruelke | H04B 1/001 455/130 |
| 8,638,174 B2 * | 1/2014 | Pavlovic | G06F 1/025 327/299 |
| 8,680,929 B2 * | 3/2014 | De Jong | H03D 7/166 327/175 |
| 2002/0012407 A1 * | 1/2002 | Sakurai | H03D 3/008 375/327 |

(Continued)

FOREIGN PATENT DOCUMENTS

| | | |
|---|---|---|
| CN | 1241326 A | 1/2000 |
| CN | 102291151 A | 12/2011 |

(Continued)

*Primary Examiner* — Lana N Le
(74) *Attorney, Agent, or Firm* — Leydig, Voit & Mayer, Ltd.

(57) ABSTRACT

The present disclosure provides a receiver and a signal processing method. The receiver includes: a first frequency mixer, performing frequency mixing on a received signal by using a square wave signal to obtain a first frequency-mixed signal; a first low-pass filter, filtering the first frequency-mixed signal to obtain a first filtered signal; a first analog-to-digital converter, performing analog-to-digital conversion on the first filtered signal to obtain a first sampled signal; and a signal processing unit, estimating, according to the first sampled signal, an information symbol transmitted by a transmit end, where the square wave signal is generated according to a carrier frequency estimation value of the received signal. The receiver according to embodiments of the present disclosure provides better flexibility.

18 Claims, 9 Drawing Sheets

(56) References Cited

U.S. PATENT DOCUMENTS

| | | | |
|---|---|---|---|
| 2003/0181218 A1* | 9/2003 | Mukai | H04W 8/245 |
| | | | 455/550.1 |
| 2004/0100391 A1* | 5/2004 | Guthrie | G08C 17/02 |
| | | | 340/4.3 |
| 2006/0040634 A1* | 2/2006 | Wang | H03D 7/165 |
| | | | 455/313 |
| 2010/0104001 A1* | 4/2010 | Lee | H04B 1/30 |
| | | | 375/240 |
| 2010/0130155 A1 | 5/2010 | Khoini-Poorfard et al. | |
| 2010/0295598 A1* | 11/2010 | Darabi | H03B 21/01 |
| | | | 327/355 |
| 2014/0175891 A1* | 6/2014 | Kim | H02J 3/00 |
| | | | 307/85 |
| 2015/0155907 A1* | 6/2015 | Shen | H04B 1/0475 |
| | | | 375/297 |

FOREIGN PATENT DOCUMENTS

| | | |
|---|---|---|
| EP | 14898726.6 | 7/2017 |
| WO | 0119047 A1 | 3/2001 |
| WO | 2014027232 A1 | 2/2014 |

* cited by examiner

RECEIVER AND SIGNAL PROCESSING METHOD

CROSS-REFERENCE TO RELATED APPLICATIONS

This application is a continuation of International Application No. PCT/CN2014/083239, filed on Jul. 29, 2014, the disclosure of which is hereby incorporated by reference in its entirety.

TECHNICAL FIELD

Embodiments of the present disclosure relate to the field of wireless communications and, more specifically, to a receiver and a signal processing method.

BACKGROUND

In a communications system, multiple narrowband signals (that is, a multi-subband signal) usually need to be received. Carrier frequencies (a carrier frequency may be represented as a frequency or an angular frequency) of all the narrowband signals are different from each other. In addition, bandwidths of all the narrowband signals may be the same or be different. A narrowband signal may also be referred to as a subband signal.

A technology of estimating, according to a multi-subband signal, an information symbol transmitted at each carrier frequency is generally referred to as a subband sampling technology. It is assumed that the multi-subband signal includes a maximum of k narrowband signals, and carrier frequencies of the k narrowband signals are different from each other. In this case, a set of hardware needs to be prepared for each carrier frequency of the k carrier frequencies. Each set of hardware includes two channels: one channel is used to perform sine wave frequency mixing, filtering, and sampling (analog-to-digital conversion) sequentially, and the other channel is used to perform cosine wave frequency mixing, filtering, and sampling sequentially. Frequencies of a sine wave and a cosine wave that are used on the two channels are the same and are equal to an angular frequency of a corresponding carrier frequency.

However, a sine wave signal or cosine wave signal that is used for frequency mixing is generated by a conventional analog device. This analog device generates a monophonic (that is, single-carrier) signal within any period of time, which requires as small a high-order harmonic wave as possible. Moreover, parameters of this analog device are preconfigured fixed values, and are difficult to adjust or modify. Therefore, when a receiver is being designed, a quantity of channels required in the receiver needs to be designed according to a maximum quantity of narrowband signals included in a multi-subband signal. For example, if the multi-subband signal includes a maximum of k narrowband signals, a receiver including 2k channels needs to be designed. Designing of this receiver lacks flexibility.

SUMMARY

Embodiments of the present disclosure provide a receiver and a signal processing method, to flexibly meet a requirement.

According to a first aspect, a receiver is provided, including: a first frequency mixer, configured to perform frequency mixing on a first received signal by using a first square wave signal to obtain a first frequency-mixed signal; a first low-pass filter, configured to: receive the first frequency-mixed signal from the first frequency mixer and perform low-pass filtering on the first frequency-mixed signal to obtain a first filtered signal; a first analog-to-digital converter, configured to: receive the first filtered signal from the first low-pass filter and perform analog-to-digital conversion on the first filtered signal to obtain a first sampled signal; and a signal processing unit, configured to: receive the first sampled signal from the first analog-to-digital converter and estimate, according to the first sampled signal, an information symbol transmitted by a transmit end, where the first square wave signal is generated according to a carrier frequency estimation value of the first received signal.

According to the first aspect, in an implementation manner, the receiver further includes: a second frequency mixer, configured to perform frequency mixing on the first received signal by using a second square wave signal to obtain a second frequency-mixed signal; a second low-pass filter, configured to: receive the second frequency-mixed signal from the second frequency mixer and perform low-pass filtering on the second frequency-mixed signal to obtain a second filtered signal; and a second analog-to-digital converter, configured to: receive the second filtered signal from the second low-pass filter and perform analog-to-digital conversion on the second filtered signal to obtain a second sampled signal, where the signal processing unit is further configured to: receive the second sampled signal from the second analog-to-digital converter and estimate, according to the first sampled signal and the second sampled signal, an information symbol transmitted by a transmit end, and the second square wave signal is generated according to a carrier frequency estimation value of the first received signal.

According to the first aspect and the foregoing implementation manner thereof, in another implementation manner, the receiver further includes: a third frequency mixer, configured to perform frequency mixing on a second received signal by using a third square wave signal to obtain a third frequency-mixed signal; a third low-pass filter, configured to: receive the third frequency-mixed signal from the third frequency mixer and perform low-pass filtering on the third frequency-mixed signal to obtain a third filtered signal; a third analog-to-digital converter, configured to: receive the third filtered signal from the third low-pass filter and perform analog-to-digital conversion on the third filtered signal to obtain a third sampled signal; a fourth frequency mixer, configured to perform frequency mixing on the second received signal by using a fourth square wave signal to obtain a fourth frequency-mixed signal; a fourth low-pass filter, configured to: receive the fourth frequency-mixed signal from the fourth frequency mixer and perform low-pass filtering on the fourth frequency-mixed signal to obtain a fourth filtered signal; and a fourth analog-to-digital converter, configured to: receive the fourth filtered signal from the fourth low-pass filter and perform analog-to-digital conversion on the fourth filtered signal to obtain a fourth sampled signal, where the signal processing unit is further configured to: receive the third sampled signal from the third analog-to-digital converter, receive the fourth sampled signal from the fourth analog-to-digital converter, and estimate, according to the first sampled signal, the second sampled signal, the third sampled signal, and the fourth sampled signal, an information symbol transmitted by a transmit end, and the third square wave signal and the fourth square wave signal are generated according to a carrier frequency estimation value of the second received signal, and the carrier frequency estimation value of the first received signal is different from the carrier frequency estimation value of the second received signal.

According to the first aspect and the foregoing implementation manner thereof, in another implementation manner, the first square wave signal is $\text{sign}(\sin(f_1 \times 2\pi \times t))$, and the second square wave signal is $\text{sign}(\cos(f_1 \times 2\pi \times t))$, where sign is a sign function, t represents a time, and $f_1$ is the carrier frequency estimation value of the first received signal.

According to the first aspect and the foregoing implementation manner thereof, in another implementation manner, the third square wave signal is $\text{sign}(\sin(f_2 \times 2\pi \times t))$, and the fourth square wave signal is $\text{sign}(\cos(f_2 \times 2\pi \times t))$; or the third square wave signal is $\text{sign}(\cos(f_2 \times 2\pi \times t))$, and the fourth square wave signal is $\text{sign}(\sin(f_2 \times 2\pi \times t))$, where sign is a sign function, t represents a time, and $f_2$ is the carrier frequency estimation value of the second received signal.

According to the first aspect and the foregoing implementation manner thereof, in another implementation manner, the first square wave signal is $\text{sign}\{\sin(f_1 \times 2\pi \times t) + \sin((f_3 + fp) \times 2\pi \times t)\}$, and the second square wave signal is $\text{sign}\{\cos(f_1 \times 2\pi \times t) + \cos((f_3 + fp) \times 2\pi \times t)\}$; or the first square wave signal is $\text{sign}\{\sin(f_1 \times 2\pi \times t) + \sin((f_3 - fp) \times 2\pi \times t)\}$, and the second square wave signal is $\text{sign}\{\cos(f_1 \times 2\pi \times t) + \cos((f_3 - fp) \times 2\pi \times t)\}$; or the first square wave signal is $\text{sign}\{\sin((f_1 + fp) \times 2\pi \times t) + \sin(f_3 \times 2\pi \times t)\}$, and the second square wave signal is $\text{sign}\{\cos((f_1 + fp) \times 2\pi \times t) + \cos(f_3 \times 2\pi \times t)\}$; or the first square wave signal is $\text{sign}\{\sin((f_1 - fp) \times 2\pi \times t) + \sin(f_3 \times 2\pi \times t)\}$, and the second square wave signal is $\text{sign}\{\cos((f_1 - fp) \times 2\pi \times t) + \cos(f_3 \times 2\pi \times t)\}$; or the first square wave signal is $\text{sign}\{\sin(f_1 \times 2\pi \times t)\} + \text{sign}\{\sin((f_3 + fp) \times 2\pi \times t)\}$, and the second square wave signal is $\text{sign}\{\cos(f_1 \times 2\pi \times t)\} + \text{sign}\{\cos((f_3 + fp) \times 2\pi \times t)\}$; or the first square wave signal is $\text{sign}\{\sin(f_1 \times 2\pi \times t)\} + \text{sign}\{\sin((f_3 - fp) \times 2\pi \times t)\}$, and the second square wave signal is $\text{sign}\{\cos(f_1 \times 2\pi \times t)\} + \text{sign}\{\cos((f_3 - fp) \times 2\pi \times t)\}$; or the first square wave signal is $\text{sign}\{\sin((f_1 + fp) \times 2\pi \times t)\} + \text{sign}\{\sin(f_3 \times 2\pi \times t)\}$, and the second square wave signal is $\text{sign}\{\cos((f_1 + fp) \times 2\pi \times t\} + \text{sign}\{\cos(f_3 \times 2\pi \times t)\}$; or the first square wave signal is $\text{sign}\{\sin((f_1 - fp) \times 2\pi \times t)\} + \text{sign}\{\sin(f_3 \times 2\pi \times t)\}$, and the second square wave signal is $\text{sign}\{\cos((f_1 - fp) \times 2\pi \times t)\} + \text{sign}\{\cos(f_3 \times 2\pi \times t)\}$; or the first square wave signal is $\text{sign}\{\cos(f_1 \times 2\pi \times t) + \cos((f_3 + fp) \times 2\pi \times t)\}$, and the second square wave signal is $\text{sign}\{\sin(f_1 \times 2\pi \times t) + \sin((f_3 + fp) \times 2\pi \times t)\}$; or the first square wave signal is $\text{sign}\{\cos(f_1 \times 2\pi \times t) + \cos((f_3 - fp) \times 2\pi \times t)\}$, and the second square wave signal is $\text{sign}\{\sin(f_1 \times 2\pi \times t) + \sin((f_3 - fp) \times 2\pi \times t)\}$; or the first square wave signal is $\text{sign}\{\cos((f_1 + fp) \times 2\pi \times t) + \cos(f_3 \times 2\pi \times t)\}$, and the second square wave signal is $\text{sign}\{\sin((f_1 + fp) \times 2\pi \times t) + \sin(f_3 \times 2\pi \times t)\}$; or the first square wave signal is $\text{sign}\{\cos((f_1 - fp) \times 2\pi \times t) + \cos(f_3 \times 2\pi \times t)\}$, and the second square wave signal is $\text{sign}\{\sin((f_1 - fp) \times 2\pi \times t) + \sin(f_3 \times 2\pi \times t)\}$; or the first square wave signal is $\text{sign}\{\cos(f_1 \times 2\pi \times t)\} + \text{sign}\{\cos((f_3 + fp) \times 2\pi \times t)\}$, and the second square wave signal is $\text{sign}\{\sin(f_1 \times 2\pi \times t)\} + \text{sign}\{\sin((f_3 + fp) \times 2\pi \times t)\}$; or the first square wave signal is $\text{sign}\{\cos(f_1 \times 2\pi \times t)\} + \text{sign}\{\cos((f_3 - fp) \times 2\pi \times t)\}$, and the second square wave signal is $\text{sign}\{\sin(f_1 \times 2\pi \times t)\} + \text{sign}\{\sin((f_3 - fp) \times 2\pi \times t)\}$; or the first square wave signal is $\text{sign}\{\cos((f_1 + fp) \times 2\pi \times t\} + \text{sign}\{\cos(f_3 \times 2\pi \times t)\}$, and the second square wave signal is $\text{sign}\{\sin((f_1 + fp) \times 2\pi \times t)\} + \text{sign}\{\sin(f_3 \times 2\pi \times t)\}$; or the first square wave signal is $\text{sign}\{\cos((f_1 - fp) \times 2\pi \times t)\} + \text{sign}\{\cos(f_3 \times 2\pi \times t)\}$, and the second square wave signal is $\text{sign}\{\sin((f_1 - fp) \times 2\pi \times t)\} + \text{sign}\{\sin(f_3 \times 2\pi \times t)\}$, where sign is a sign function, t represents a time, fp is a minimum frequency or a fundamental frequency of the first square wave signal or the second square wave signal, $f_1$ and $f_3$ are the carrier frequency estimation values of the first received signal, and $f_1 \neq f_3$.

According to the first aspect and the foregoing implementation manner thereof, in another implementation manner, bandwidths of the first low-pass filter and the second low-pass filter range between $(-fs/2, fs/2)$; sampling rates of the first analog-to-digital converter and the second analog-to-digital converter are fs; and fs=fp and fs>B, where fp is a minimum frequency or a fundamental frequency of the first square wave signal or the second square wave signal, and B is a bandwidth of the first square wave signal or the second square wave signal.

According to the first aspect and the foregoing implementation manner thereof, in another implementation manner, bandwidths of the first low-pass filter and the second low-pass filter range between $(-fs \times 1.5, fs \times 1.5)$; sampling rates of the first analog-to-digital converter and the second analog-to-digital converter are $3 \times fs$; and fs=fp and fs>B, where fp is a minimum frequency or a fundamental frequency of the first square wave signal or the second square wave signal, and B is a bandwidth of the first square wave signal or the second square wave signal.

According to the first aspect and the foregoing implementation manners thereof, in another implementation manner, the receiver further includes: a fifth frequency mixer, configured to perform frequency mixing on the first received signal by using the first square wave signal to obtain a fifth frequency-mixed signal; a fifth low-pass filter, configured to: receive the fifth frequency-mixed signal from the fifth frequency mixer and perform low-pass filtering on the fifth frequency-mixed signal to obtain a fifth filtered signal; a fifth analog-to-digital converter, configured to: receive the fifth filtered signal from the fifth low-pass filter and perform analog-to-digital conversion on the fifth filtered signal to obtain a fifth sampled signal; a sixth frequency mixer, configured to perform frequency mixing on the first received signal by using the second square wave signal to obtain a sixth frequency-mixed signal; a sixth low-pass filter, configured to: receive the sixth frequency-mixed signal from the sixth frequency mixer and perform low-pass filtering on the sixth frequency-mixed signal to obtain a sixth filtered signal; and a sixth analog-to-digital converter, configured to: receive the sixth filtered signal from the sixth low-pass filter and perform analog-to-digital conversion on the sixth filtered signal to obtain a sixth sampled signal, where the signal processing unit is further configured to: receive the fifth sampled signal from the fifth analog-to-digital converter, receive the sixth sampled signal from the sixth analog-to-digital converter, and estimate, according to the first sampled signal, the second sampled signal, the fifth sampled signal, and the sixth sampled signal, an information symbol transmitted by a transmit end.

According to the first aspect and the foregoing implementation manners thereof, in another implementation manner, the first received signal is a signal received by a radio frequency antenna.

According to the first aspect and the foregoing implementation manners thereof, in another implementation manner, the receiver further includes a filter, configured to perform filtering processing on a signal received by a radio frequency antenna, to obtain the first received signal.

According to the first aspect and the foregoing implementation manners thereof, in another implementation manner, a digital device includes a shift register.

According to the first aspect and the foregoing implementation manners thereof, in another implementation manner, the first square wave signal is generated by the digital device by means of a first pseudo random sequence, and the first pseudo random sequence is generated according to the carrier frequency estimation value of the first received signal.

According to the first aspect and the foregoing implementation manners thereof, in another implementation manner, the first pseudo random sequence is obtained by performing quantization processing on a sine signal and/or a cosine signal that are/is based on the carrier frequency estimation value of the first received signal.

According to a second aspect, a signal processing method is provided, including: performing frequency mixing on a first received signal by using a first square wave signal to obtain a first frequency-mixed signal, where the first received signal includes a narrowband signal whose carrier frequency is $f_1$; performing low-pass filtering on the first frequency-mixed signal to obtain a first filtered signal; performing analog-to-digital conversion on the first filtered signal to obtain a first sampled signal; and estimating, according to the first sampled signal, an information symbol transmitted by a transmit end, where the first square wave signal is generated according to a carrier frequency estimation value of the first received signal.

According to the second aspect, in an implementation manner, the signal processing method further includes: performing frequency mixing on the first received signal by using a second square wave signal to obtain a second frequency-mixed signal; performing low-pass filtering on the second frequency-mixed signal to obtain a second filtered signal; and performing analog-to-digital conversion on the second filtered signal to obtain a second sampled signal, where the estimating, according to the first sampled signal, an information symbol transmitted by a transmit end includes: estimating, according to the first sampled signal and the second sampled signal, an information symbol transmitted by a transmit end; and the second square wave signal is generated according to a carrier frequency estimation value of the first received signal.

According to the second aspect and the foregoing implementation manner thereof, in another implementation manner, the method further includes: performing frequency mixing on a second received signal by using a third square wave signal to obtain a third frequency-mixed signal; performing low-pass filtering on the third frequency-mixed signal to obtain a third filtered signal; performing analog-to-digital conversion on the third filtered signal to obtain a third sampled signal; performing frequency mixing on the second received signal by using a fourth square wave signal to obtain a fourth frequency-mixed signal; performing low-pass filtering on the fourth frequency-mixed signal to obtain a fourth filtered signal; and performing analog-to-digital conversion on the fourth filtered signal to obtain a fourth sampled signal, where the estimating, according to the first sampled signal and the second sampled signal, an information symbol transmitted by a transmit end includes: estimating, according to the first sampled signal, the second sampled signal, the third sampled signal, and the fourth sampled signal, an information symbol transmitted by a transmit end; and the third square wave signal and the fourth square wave signal are generated according to a carrier frequency estimation value of the second received signal, and the carrier frequency estimation value of the first received signal is different from the carrier frequency estimation value of the second received signal.

According to the second aspect and the foregoing implementation manner thereof, in another implementation manner, the first square wave signal is $\text{sign}(\sin(f_1 \times 2\pi \times t))$, and the second square wave signal is $\text{sign}(\cos(f_1 \times 2\pi \times t))$; or the first square wave signal is $\text{sign}(\cos(f_1 \times 2\pi \times t))$, and the second square wave signal is $\text{sign}(\sin(f_1 \times 2\pi \times t))$, where sign is a sign function, t represents a time, and $f_1$ is the carrier frequency estimation value of the first received signal.

According to the second aspect and the foregoing implementation manner thereof, in another implementation manner, the third square wave signal is $\text{sign}(\sin(f_2 \times 2\pi \times t))$, and the fourth square wave signal is $\text{sign}(\cos(f_2 \times 2\pi \times t))$; or the third square wave signal is $\text{sign}(\cos(f_2 \times 2\pi \times t))$, and the fourth square wave signal is $\text{sign}(\sin(f_2 \times 2\pi \times t))$, where sign is a sign function, t represents a time, and $f_2$ is the carrier frequency estimation value of the second received signal.

According to the second aspect and the foregoing implementation manner thereof, in another implementation manner, the first square wave signal is $\text{sign}\{\sin(f_1 \times 2\pi \times t) + \sin((f_3+fp) \times 2\pi \times t)\}$, and the second square wave signal is $\text{sign}\{\cos(f_1 \times 2\pi \times t) + \cos((f_3+fp) \times 2\pi \times t)\}$; or the first square wave signal is $\text{sign}\{\sin(f_1 \times 2\pi \times t) + \sin((f_3-fp) \times 2\pi \times t)\}$, and the second square wave signal is $\text{sign}\{\cos(f_1 \times 2\pi \times t) + \cos((f_3-fp) \times 2\pi \times t)\}$; or the first square wave signal is $\text{sign}\{\sin((f_1+fp) \times 2\pi \times t) + \sin(f_3 \times 2\pi \times t)\}$, and the second square wave signal is $\text{sign}\{\cos((f_1+fp) \times 2\pi \times t) + \cos(f_3 \times 2\pi \times t)\}$; or the first square wave signal is $\text{sign}\{\sin((f_1-fp) \times 2\pi \times t) + \sin(f_3 \times 2\pi \times t)\}$, and the second square wave signal is $\text{sign}\{\cos((f_1-fp) \times 2\pi \times t) + \cos(f_3 \times 2\pi \times t)\}$; or the first square wave signal is $\text{sign}\{\sin(f_1 \times 2\pi \times t)\} + \text{sign}\{\sin((f_3+fp) \times 2\pi \times t)\}$, and the second square wave signal is $\text{sign}\{\cos(f_1 \times 2\pi \times t)\} + \text{sign}\{\cos((f_3+fp) \times 2\pi \times t)\}$; or the first square wave signal is $\text{sign}\{\sin(f_1 \times 2\pi \times t)\} + \text{sign}\{\sin((f_3-fp) \times 2\pi \times t)\}$, and the second square wave signal is $\text{sign}\{\cos(f_1 \times 2\pi \times t)\} + \text{sign}\{\cos((f_3-fp) \times 2\pi \times t)\}$; or the first square wave signal is $\text{sign}\{\sin((f_1+fp) \times 2\pi \times t)\} + \text{sign}\{\sin(f_3 \times 2\pi \times t)\}$, and the second square wave signal is $\text{sign}\{\cos((f_1+fp) \times 2\pi \times t)\} + \text{sign}\{\cos(f_3 \times 2\pi \times t)\}$; or the first square wave signal is $\text{sign}\{\sin((f_1-fp) \times 2\pi \times t)\} + \text{sign}\{\sin(f_3 \times 2\pi \times t)\}$, and the second square wave signal is $\text{sign}\{\cos((f_1-fp) \times 2\pi \times t)\} + \text{sign}\{\cos(f_3 \times 2\pi \times t)\}$; or the first square wave signal is $\text{sign}\{\cos(f_1 \times 2\pi \times t) + \cos((f_3+fp) \times 2\pi \times t)\}$, and the second square wave signal is $\text{sign}\{\sin(f_1 \times 2\pi \times t) + \sin((f_3+fp) \times 2\pi \times t)\}$; or the first square wave signal is $\text{sign}\{\cos(f_1 \times 2\pi \times t) + \cos((f_3-fp) \times 2\pi \times t)\}$, and the second square wave signal is $\text{sign}\{\sin(f_1 \times 2\pi \times t) + \sin((f_3 \times fp) \times 2\pi \times t)\}$; or the first square wave signal is $\text{sign}\{\cos((f_1+fp) \times 2\pi \times t) + \cos(f_3 \times 2\pi \times t)\}$, and the second square wave signal is $\text{sign}\{\sin((f_1+fp) \times 2\pi \times t) + \sin(f_3 \times 2\pi \times t)\}$; or the first square wave signal is $\text{sign}\{\cos((f_1-fp) \times 2\pi \times t) + \cos(f_3 \times 2\pi \times t)\}$, and the second square wave signal is $\text{sign}\{\sin((f_1-fp) \times 2\pi \times t) + \sin(f_3 \times 2\pi \times t)\}$; or the first square wave signal is $\text{sign}\{\cos(f_1 \times 2\pi \times t)\} + \text{sign}\{\cos((f_3+fp) \times 2\pi \times t)\}$, and the second square wave signal is $\text{sign}\{\sin(f_1 \times 2\pi \times t)\} + \text{sign}\{\sin((f_3+fp) \times 2\pi \times t)\}$; or the first square wave signal is $\text{sign}\{\cos(f_1 \times 2\pi \times t)\} + \text{sign}\{\cos((f_3-fp) \times 2\pi \times t)\}$, and the second square wave signal is $\text{sign}\{\sin(f_1 \times 2\pi \times t)\} + \text{sign}\{\sin((f_3-fp) \times 2\pi \times t)\}$; or the first square wave signal is $\text{sign}\{\cos((f_1+fp) \times 2\pi \times t)\} + \text{sign}\{\cos(f_3 \times 2\pi \times t)\}$, and the second square wave signal is $\text{sign}\{\sin((f_1+fp) \times 2\pi \times t)\} + \text{sign}\{\sin(f_3 \times 2\pi \times t)\}$; or the first square wave signal is sign{ cos(($f_1$-fp)×2πxt)}+sign{ cos($f_3$×2πxt)}, and the second square wave signal is sign{ sin(($f_1$-fp)×2πxt)}+sign{ sin($f_3$×2πxt)}, where sign is a sign function, t represents a time, fp is a minimum frequency or a fundamental frequency of the first square wave signal or the second square wave signal, $f_1$ and $f_3$ are the carrier frequency estimation values of the first received signal, and $f_1 \neq f_3$.

According to the second aspect and the foregoing implementation manners thereof, in another implementation manner, the signal processing method further includes: performing frequency mixing on the first received signal by using the first square wave signal to obtain a fifth frequency-mixed signal; performing low-pass filtering on the fifth frequency-mixed signal to obtain a fifth filtered signal; performing analog-to-digital conversion on the fifth filtered signal to obtain a fifth sampled signal; performing frequency mixing on the first received signal by using the second square wave signal to obtain a sixth frequency-mixed signal; performing low-pass filtering on the sixth frequency-mixed signal to obtain a sixth filtered signal; and performing analog-to-digital conversion on the sixth filtered signal to obtain a sixth sampled signal, where the estimating, according to the first sampled signal and the second sampled signal, an information symbol transmitted by a transmit end includes: estimating, according to the first sampled signal, the second sampled signal, the fifth sampled signal, and the sixth sampled signal, an information symbol transmitted by a transmit end.

According to the second aspect and the foregoing implementation manners thereof, in another implementation manner, the first square wave signal is generated by a digital device by means of a first pseudo random sequence, and the first pseudo random sequence is generated according to the carrier frequency estimation value of the first received signal.

According to the second aspect and the foregoing implementation manners thereof, in another implementation manner, the first pseudo random sequence is obtained by the digital device by performing quantization processing on a sine signal and/or a cosine signal that are/is based on the carrier frequency estimation value of the first received signal.

The receiver according to the embodiments of the present disclosure performs frequency mixing on a received signal by using a square wave signal. In this way, because the square wave signal may be set as needed, the receiver according to the embodiments of the present disclosure provides better flexibility.

BRIEF DESCRIPTION OF DRAWINGS

To describe the technical solutions in the embodiments of the present disclosure more clearly, the following briefly describes the accompanying drawings required for describing the embodiments or the prior art. Apparently, the accompanying drawings in the following description show only some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

The technical solutions of the present disclosure may be applied to various communications systems, such as a Global System for Mobile Communications (GSM, Global System of Mobile communication), a Code Division Multiple Access (CDMA, Code Division Multiple Access) system, Wideband Code Division Multiple Access (WCDMA, Wideband Code Division Multiple Access Wireless), a general packet radio service (GPRS, General Packet Radio Service), and Long Term Evolution (LTE, Long Term Evolution).

User equipment (UE, User Equipment), also referred to as a mobile terminal (Mobile Terminal), mobile user equipment, and the like, may communicate with one or more core networks by using a radio access network (for example, RAN, Radio Access Network). The user equipment may be a mobile terminal, for example, a mobile phone (also referred to as a "cellular" phone) or a computer with a mobile terminal. For example, the user equipment may be a portable, pocket-sized, handheld, computer built-in, or in-vehicle mobile apparatus, which exchanges language and/or data with the radio access network.

A base station may be a base station (BTS, Base Transceiver Station) in GSM or CDMA, or may be a base station (NodeB) in WCDMA, or may be an evolved NodeB (eNB or e-NodeB, evolutional Node B) in LTE, which is not limited in the present disclosure. However, for ease of description, the following embodiments are described by using a Node B as an example.

Figure 1:
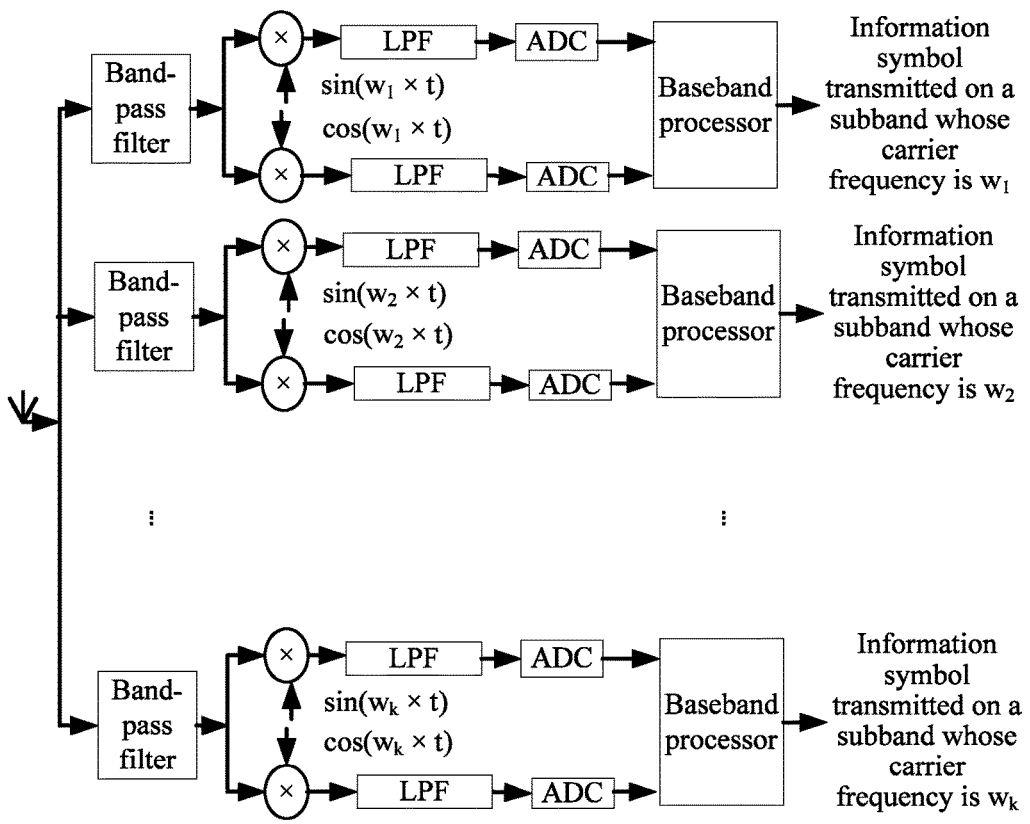
FIG. 1 is a schematic block diagram of a conventional receiver including a conventional frequency mixer.

FIG. 1 is a schematic block diagram of a conventional receiver including a conventional frequency mixer. In FIG. 1, a multi-subband signal may include a maximum of k narrowband signals whose carrier frequency may be represented as $\{f_i\}$ or $\{w_i\}$, where $w_i=2\pi \times f_i$, $f_i$ is a frequency value, $w_i$ is an angular frequency value, $i=1, 2, \ldots, k$, and k is a positive integer. A bandwidth of each narrowband signal is denoted as $B_i$. It is well known that, each narrowband signal whose carrier angular frequency is $w_i$ generally includes an inphase component and a quadrature component. Generally, a sine signal ($A\sin w_i t$) and a cosine signal ($A\cos w_i t$) are generally used to describe the two components. A cosine component is referred to as the inphase component, that is, an I component. A sine component is referred to as the quadrature component, that is, a Q component.

As shown in FIG. 1, each device is corresponding to only one carrier angular frequency $w_i$. Specifically, each device may include a band-pass filter, two frequency mixing channels, and a baseband processor, where one frequency mixing channel includes a sine wave frequency mixing device, a low-pass filter (LPF, Low Pass Filter), and an analog-to-digital converter (ADC, Analog-to-Digital Converter), and the other frequency mixing channel includes a cosine wave frequency mixing device, a low-pass filter, and an analog-to-digital converter.

It can be seen that, a set of hardware in the conventional receiver can be used for only one fixed frequency band. In other words, each frequency band needs to have a corresponding set of hardware; otherwise, the receiver cannot estimate an information symbol transmitted on the frequency band.

In addition, a trend of a future communications system is that there is a large quantity (which is set to M, for example, M=12) of available frequency bands, and therefore, hardware including 2M (=24) channels is required according to the solution of FIG. 1. Hardware overheads are excessively large according to the receiver solution of FIG. 1, and for a newly added frequency band, corresponding hardware even cannot be added to a mobile terminal of a limited size. On the other hand, some (a maximum value is set to K=4, and it is possible that K is far less than M) frequency bands are usually selected and used for the future communications system at a moment; as a result, much multi-channel hardware at a receive end is idle.

Moreover, the receiver solution of FIG. 1 lacks flexibility. For example, when a frequency band used by an operator changes, or available frequency bands increase, an ADC system of a base station cannot support multi-channel hardware. In this case, the entire ADC system generally needs to be redesigned, and hardware needs to be replaced. Consequently, maintenance/upgrade costs increase.

Figure 2:
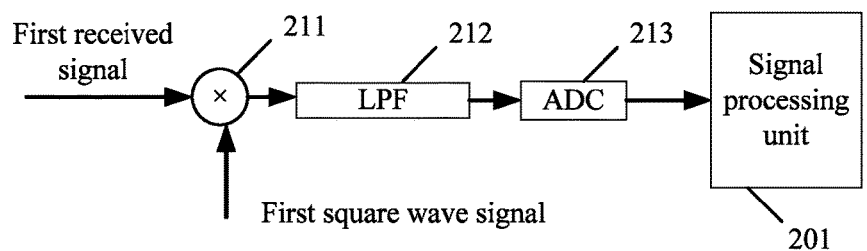
FIG. 2 is a block diagram of a receiver according to an embodiment of the present disclosure.

FIG. 2 is a block diagram of a receiver according to an embodiment of the present disclosure. As shown in FIG. 2, the receiver may include a first frequency mixer 211, a first low-pass filter 212, a first analog-to-digital converter 213, and a signal processing unit 201.

The first frequency mixer 211 performs frequency mixing on a first received signal by using a first square wave signal to obtain a first frequency-mixed signal.

The first low-pass filter 212 is configured to: receive the first frequency-mixed signal from the first frequency mixer 211 and perform low-pass filtering on the first frequency-mixed signal to obtain a first filtered signal.

The first analog-to-digital converter 213 is configured to: receive the first filtered signal from the first low-pass filter 212 and perform analog-to-digital conversion on the first filtered signal to obtain a first sampled signal.

The signal processing unit 201 is configured to: receive the first sampled signal from the first analog-to-digital converter 213 and estimate, according to the first sampled signal, an information symbol transmitted by a transmit end.

The first square wave signal is generated according to a carrier frequency estimation value of the first received signal.

The receiver according to this embodiment of the present disclosure performs frequency mixing on a received signal by using a square wave signal. In this way, because the square wave signal may be set as needed, the receiver according to this embodiment of the present disclosure provides better flexibility.

A specific form of the carrier frequency estimation value is not limited in this embodiment of the present disclosure. For example, the carrier frequency estimation value may be represented as a frequency value $f_i$ or an angular frequency value $w_i$, or in another equivalent form. A person skilled in the art can use a proper estimation value form according to an actual scenario. The following embodiments are described mainly by using an example in which the frequency value $f_i$ or the angular frequency value $w_i$ is used as the carrier frequency estimation value. However, the person skilled in the art easily figures out an equivalent alternative solution, and such alternative solution still falls within the scope of this embodiment of the present disclosure.

Specifically, a frequency mixer used in this embodiment of the present disclosure uses a square wave signal, which is different from a conventional frequency mixer that uses a monophonic signal for frequency mixing. Moreover, an analog device is used in the conventional frequency mixer. Parameters of this analog device are difficult to adjust after configuration. On the contrary, a digital device is used in this embodiment of the present disclosure to generate the square wave signal required for frequency mixing, and the square wave signal can be set flexibly as needed. It should be pointed out that, the square wave signal is a general term for a type of signal in the art. This type of signal is different from the monophonic signal conventionally used for frequency mixing and may also be referred to as a multi-tone signal. That is, strength of a multiplied-frequency component of a multiple-harmonic wave of the signal is strong enough compared with strength of a fundamental frequency component. Therefore, impact of the multiplied-frequency component needs to be considered during a receiving process, and the multiplied-frequency component can be used or processed instead of being ignored. On the contrary, only impact of the monophonic signal is usually considered for the conventional frequency mixer that uses the monophonic signal for frequency mixing. Compared with the strength of the fundamental frequency component, the multiplied-frequency component of the multiple-harmonic wave has relatively small strength and may be usually ignored. In conclusion, a waveform of the square wave signal described in the present disclosure is not limited to a square wave, but refers to a type of signal whose fundamental frequency component and multiplied-frequency component have strength of one magnitude or relatively similar magnitudes.

A carrier frequency estimation value of a received signal may be obtained by means of estimation by a receive end, or may be notified by the transmit end to a receive end, or may be obtained based on a communications protocol with which both a receive end and the transmit end comply, or may be obtained through negotiation between a receive end and the transmit end in advance. A manner of obtaining the carrier frequency estimation value of the received signal is not limited in this embodiment of the present disclosure.

An apparatus for generating the square wave signal may be located in the receiver, or may be located outside the receiver, and is connected to the receiver by using a suitable line.

Optionally, in an embodiment, the first square wave signal may be generated by a digital device by means of a first pseudo random sequence, and the first pseudo random sequence is generated according to a carrier frequency estimation value (it is assumed that a frequency estimation value $f_1$ is used, and certainly, an angular frequency estimation value $w_1$ may also be used equivalently) of the first received signal. In other words, the digital device may obtain a pseudo random sequence according to a carrier frequency estimation value of a received signal when generating a square wave signal, and then generate the square wave signal by means of the pseudo random sequence. However, a manner of generating the square wave signal by the digital device is not limited in this embodiment of the present disclosure. For example, a cosine signal $\cos(f_1 \times 2\pi \times t)$ or a sine signal $\sin(f_1 \times 2\pi \times t)$ may be quantized or truncated. That is, if a signal waveform value is greater than 0, the two signals are quantized to 1; or if the signal waveform value is less than 0, the two signals are quantized to −1. In this way, a proper square wave signal can be generated with no need to use the pseudo random sequence.

The first pseudo random sequence may be obtained by the digital device by performing quantization processing on a sine signal and/or a cosine signal that are/is based on the estimation value $f_1$. For example, when only one frequency mixer, a low-pass filter, and an analog-to-digital converter are retained in the receiver, the first pseudo random sequence may be obtained by the digital device by performing quantization processing on both the sine signal and the cosine signal that are based on the estimation value $f_1$. For example, the first pseudo random sequence may be set to $\text{sign}\{\sin(f_1 \times 2\pi \times t) + \cos((f_1 fp) \times 2\pi \times t)\}$ or another similar form, where fp herein is a minimum frequency or a fundamental frequency of the first square wave signal. When multiple frequency mixers, a low-pass filter, and an analog-to-digital converter are used in the receiver to process the first received signal, the first pseudo random sequence may be obtained by the digital device by performing quantization processing on the sine signal (or the cosine signal) that is based on the estimation value $f_1$.

A quantization processing manner is not limited in this embodiment of the present disclosure. For example, a sign function sign( ) may be used. In an example in which the pseudo random sequence is obtained by quantizing the sine signal $\sin(f_1 \times 2\pi \times t)$ and a corresponding square wave signal is further generated, the square wave signal may be expressed as $\text{sign}(\sin(f_1 \times 2\pi \times t))$ from a perspective of a continuous-time waveform. In practice, because the square wave signal has a timeslot width a, a time t may be set to a discrete point, for example, t=0, σ, 2σ, . . . , and (n−1) σ. In this way, a pseudo random sequence that corresponds to the square wave signal and has n items is obtained. The square wave signal may be generated according to the pseudo random sequence by using an inverse process of the foregoing process.

Figure 3:
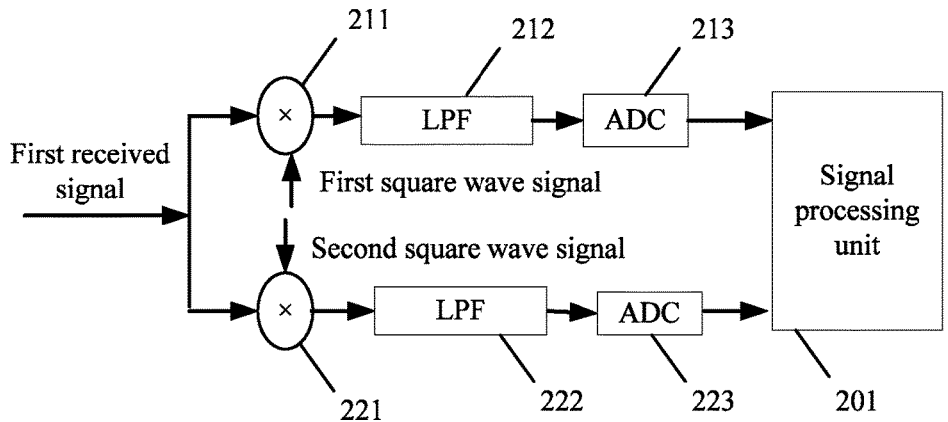
FIG. 3 is a block diagram of a receiver according to another embodiment of the present disclosure.

FIG. 3 is a block diagram of a receiver according to another embodiment of the present disclosure. Devices of the receiver in FIG. 3, which are the same as those in FIG. 2, use same reference numerals in the accompanying drawing, and therefore, repeated descriptions are omitted.

As shown in FIG. 3, in addition to a first frequency mixer 211, a first low-pass filter 212, a first analog-to-digital converter 213, and a signal processing unit 201, the receiver in FIG. 3 further includes a second frequency mixer 221, a second low-pass filter 222, and a second analog-to-digital converter 223.

The second frequency mixer 221 is configured to perform frequency mixing on a first received signal by using a second square wave signal to obtain a second frequency-mixed signal.

The second low-pass filter 222 is configured to: receive the second frequency-mixed signal from the second frequency mixer 221 and perform low-pass filtering on the second frequency-mixed signal to obtain a second filtered signal.

The second analog-to-digital converter 223 is configured to: receive the second filtered signal from the second low-pass filter 222 and perform analog-to-digital conversion on the second filtered signal to obtain a second sampled signal.

The signal processing unit 201 is further configured to: receive the second sampled signal from the second analog-to-digital converter 223 and estimate, according to the first sampled signal and the second sampled signal, an information symbol transmitted by a transmit end.

The second square wave signal is generated by a digital device according to a carrier frequency estimation value of the first received signal.

The receiver according to this embodiment of the present disclosure performs frequency mixing on a received signal by using a square wave signal. In this way, because the square wave signal may be set as needed, the receiver according to this embodiment of the present disclosure provides better flexibility.

Optionally, in an embodiment, the square wave signal may be generated by a digital device by means of a pseudo random sequence, and the pseudo random sequence is generated according to a carrier frequency estimation value of the received signal. In other words, the digital device may obtain the pseudo random sequence according to the carrier frequency estimation value of the received signal when generating the square wave signal, and then generates the square wave signal by means of the pseudo random sequence. However, a manner of generating the square wave signal by the digital device is not limited in this embodiment of the present disclosure. For example, a cosine signal $\cos(f_1 \times 2\pi \times t)$ or a sine signal $\sin(f_1 \times 2\pi \times t)$ may be quantized or truncated. That is, if a signal waveform value is greater than 0, the two signals are quantized to 1; or if the signal waveform value is less than 0, the two signals are quantized to −1. In this way, a proper square wave signal can be generated with no need to use the digital device or the pseudo random sequence.

Optionally, in an embodiment, the pseudo random sequence in this embodiment of the present disclosure may be obtained by performing quantization processing on a sine signal or a cosine signal that is based on a carrier frequency estimation value. For example, the first pseudo random sequence may be obtained by a digital device by performing quantization processing on the sine signal that is based on an estimation value $f_1$, and the second pseudo random sequence may be obtained by the digital device by performing quantization processing on the cosine signal that is based on the estimation value $f_1$, and vice versa. That is, the first pseudo random sequence may be obtained by the digital device by performing quantization processing on the cosine signal that is based on the estimation value $f_1$, and the second pseudo random sequence may be obtained by the digital device by performing quantization processing on the sine signal that is based on the estimation value $f_1$.

The receiver according to this embodiment of the present disclosure can be configured for a varying frequency band by including only one set of hardware (two frequency mixers, a low-pass filter, and an analog-to-digital converter) shown in FIG. 3. In other words, even if a frequency band for the received signal changes, the hardware does not need to be replaced, as long as the square wave signal generated by the digital device is adjusted. For example, when a frequency band used by an operator changes, or available frequency bands increase, the receiver according to this embodiment of the present disclosure can still be used without the need of replacing hardware. In this way, costs can be reduced.

For another example, when a quantity K' of frequency bands selected and used by the transmit end at a moment is less than an amount K of hardware in the receiver, the receiver according to this embodiment of the present disclosure may use 2K channels (more than 2K' channels) to receive signals on the K' frequency bands. In this way, receiving performance can be improved.

In addition, because the square wave signal includes multiple monophonic (that is, multiple carriers) signals, an amount of hardware in the receiver may be further reduced according to this embodiment of the present disclosure. For example, a quantity of hardware channels required for M narrow bands may be decreased from 2M to 2M/p (herein, p=3, 5, 7 . . . ). Specially, if the received signal includes a maximum of K narrow bands in the M narrow bands, the receiver according to this embodiment of the present disclosure may need hardware having only 2K/p channels. Therefore, hardware overheads can be further reduced.

Only an example in which the receiver has one set of hardware (including two channels of hardware) is described in the embodiment of FIG. 3. However, the amount of hardware included in the receiver is not limited in this embodiment of the present disclosure. Alternatively, multiple sets of similar hardware may be included, where the multiple sets of hardware may process a received signal on one frequency band, or may process received signals on different frequency bands.

In addition, in the receiver according to this embodiment of the present disclosure, parameters of square wave signals, of low-pass filters, or of analog-to-digital converters of each set of hardware may be the same or may be different. For example, in a case of different parameters, parameters of each set of hardware may be set according to a principle of minimizing a total sampling rate, so as to reduce power consumption. Specifically, in an embodiment, in each set of hardware, bandwidths of a low-pass filter and a low-pass filter may range between (−fs/2, fs/2), and sampling rates of an analog-to-digital converter and an analog-to-digital converter may be fs. These parameters may satisfy:

fs=fp and fs>B, where fp is a minimum frequency or a fundamental frequency of the square wave signal, and B is generally set to a maximum value of bandwidths of all narrowband signals included in the multi-subband signal described above. In some cases, B may also be set to a value slightly greater than any bandwidth of bandwidths $B_1$ of all narrowband signals included in the multi-subband signal described above, that is, a value slightly greater than any one of $B_1$, $B_2$, . . . , or $B_k$, for example, a value slightly greater than $B_2$. For example, in the example of FIG. 2, bandwidths of the first low-pass filter 212 and the second low-pass filter 222 range between (−fs/2, fs/2); sampling rates of the first analog-to-digital converter 213 and the second analog-to-digital converter 223 are fs; and fs=fp and fs>B, where fp is a minimum frequency or a fundamental frequency of the first square wave signal or the second square wave signal.

A common application scenario corresponding to the embodiment provided in FIG. 3 is as follows: a transmitted signal is a narrowband signal whose carrier angular frequency is $w_1$. In this case, the first square wave signal and the second square wave signal in FIG. 3 are sign(cos($w_1$×t)) and sign(sin($w_1$×t)), respectively. A principle of this embodiment of the present disclosure lies in that: When a square wave signal is used for frequency mixing, because a fundamental frequency component and a multiplied-frequency component of the square wave signal have almost same strength, even if in a case in which a transmitted signal includes only one narrowband signal, in a sampled signal obtained by each ADC, an inphase component and a quadrature component of the narrowband signal still interfere with each other. Therefore, sampled signals obtained by multiple ADCs need to be combined, and a corresponding signal processing algorithm needs to be used to minimize interference impact, so as to achieve an optimum receiving effect. Moreover, the first square wave signal and the second square wave signal in FIG. 3 are respectively set to sign(cos($w_1$×t)) and sign(sin($w_1$×t)) according to the carrier angular frequency $w_1$ of the narrowband signal, so as to achieve a better receiving effect, which includes obtaining a higher receiving signal-to-noise ratio. Generally, the first square wave signal sign(cos($w_1$×t)) and the second square wave signal sign(sin($w_1$×t)) described in the present disclosure essentially refer to square waves obtained by quantizing waveforms cos($w_1$×t) and sin($w_1$×t). Specifically, there may also be other various implementation manners, where sign(cos($w_1$×t)) and sign(sin($w_1$×t)) are only an implementation manner obtained by a commonly used digital device. An example of the other various implementation manners is as follows: When a square wave having four step values (which are generally represented as −2, −1, 1, and 2) can be supported by the used digital device, cos($w_1$×t) may be quantized to a closest value in a set [−2, −1, 1, 2]. A square wave is quantized at a time t within a minimum period, to obtain a square wave that has four step values and that is used for frequency mixing. A specific implementation method of quantization is known to a person skilled in the art, and is not detailed herein.

Figure 4:
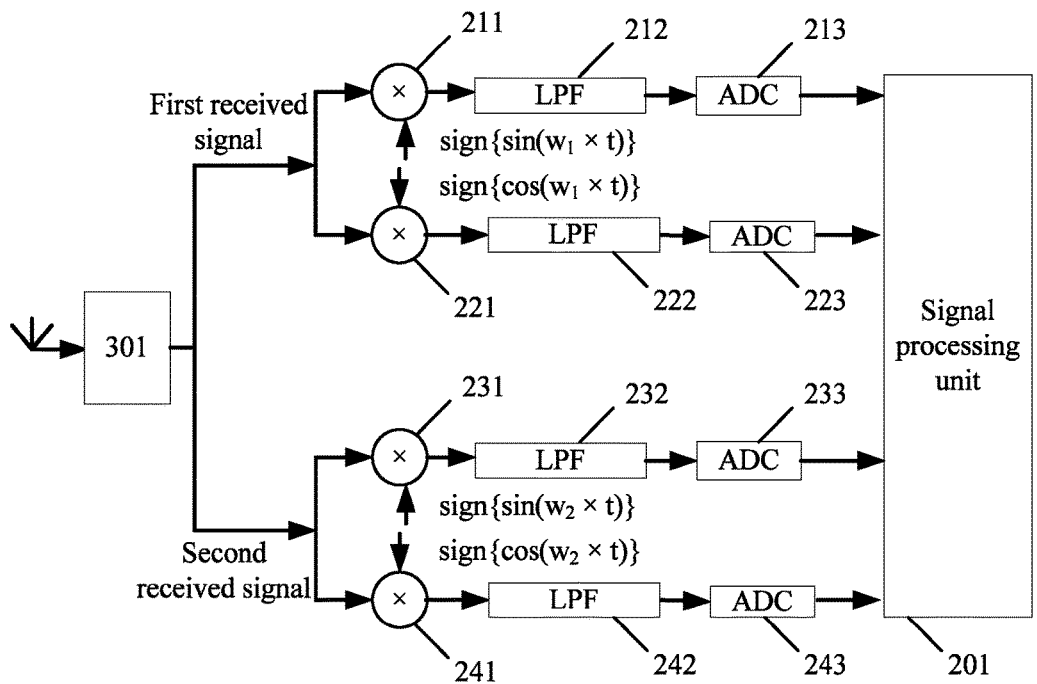
FIG. 4 is a block diagram of a receiver according to another embodiment of the present disclosure.

FIG. 4 is a block diagram of a receiver according to another embodiment of the present disclosure. Devices of the receiver in FIG. 4, which are the same as those in FIG. 2 and FIG. 3, use same reference numerals in the accompanying drawing, and therefore, repeated descriptions are omitted.

As shown in FIG. 4, in addition to a first frequency mixer 211, a first low-pass filter 212, a first analog-to-digital converter 213, a second frequency mixer 221, a second low-pass filter 222, a second analog-to-digital converter 223, and a signal processing unit 201, the receiver in FIG. 4 further includes a third frequency mixer 231, a third low-pass filter 232, a third analog-to-digital converter 233, a fourth frequency mixer 241, a fourth low-pass filter 242, and a fourth analog-to-digital converter 243.

The third frequency mixer 231 is configured to perform frequency mixing on a second received signal by using a third square wave signal to obtain a third frequency-mixed signal.

The third low-pass filter 232 is configured to: receive the third frequency-mixed signal from the third frequency mixer 231 and perform low-pass filtering on the third frequency-mixed signal to obtain a third filtered signal.

The third analog-to-digital converter 233 is configured to: receive the third filtered signal from the third low-pass filter 232 and perform analog-to-digital conversion on the third filtered signal to obtain a third sampled signal.

The fourth frequency mixer 241 is configured to perform frequency mixing on a second received signal by using a fourth square wave signal to obtain a fourth frequency-mixed signal.

The fourth low-pass filter 242 is configured to: receive the fourth frequency-mixed signal from the fourth frequency mixer 241 and perform low-pass filtering on the fourth frequency-mixed signal to obtain a fourth filtered signal.

The fourth analog-to-digital converter 243 is configured to: receive the fourth filtered signal from the fourth low-pass filter 242 and perform analog-to-digital conversion on the fourth filtered signal to obtain a fourth sampled signal.

The signal processing unit 201 is further configured to: receive the third sampled signal from the third analog-to-digital converter 233, receive the fourth sampled signal from the fourth analog-to-digital converter 243, and estimate, according to a first sampled signal, a second sampled signal, the third sampled signal, and the fourth sampled signal, an information symbol transmitted by a transmit end.

Herein, the third square wave signal and the fourth square wave signal are generated according to a carrier frequency estimation value of the second received signal, and a carrier frequency estimation value of a first received signal is different from the carrier frequency estimation value of the second received signal (that is, $f_1 \neq f_2$, or $w_1 \neq w_2$).

The embodiment of FIG. 4 is mainly specific to a case in which a received signal includes multiple narrowband signals, and carrier frequencies of the multiple narrowband signals are different from each other.

Only an example in which the receiver has two sets of hardware (including four channels of hardware) is described in the embodiment of FIG. 4, and frequencies of received signals processed by all sets of hardware may be different. The embodiment of FIG. 4 may be extended similarly to a case in which there are more sets of hardware. Such extension still falls within the scope of this embodiment of the present disclosure.

In addition, the receiver according to this embodiment of the present disclosure may include an optional filter 301, configured to perform filtering processing on a signal received by a radio frequency antenna on a carrier frequency $f_i$ (which may also be represented as $w_i$), to obtain a received signal used for frequency mixing processing. Alternatively, in a case in which the filter 301 is unnecessary, the received signal used for frequency mixing processing may be a signal received by a radio frequency antenna on the carrier frequency $f_i$ (which may also be represented as $w_i$).

Optionally, in an embodiment, the square wave signals used in this embodiment of the present disclosure may be sign(sin($w_1 \times t$)) and sign(cos($w_1 \times t$)), where $w_i$ is a carrier angular frequency of a narrowband signal in a transmitted signal including multiple narrowband signals, $w_i = f_i \times 2\pi$, i is a positive integer, sign( ) is a sign function, and t represents a time. Generally, a transmitted signal in communication includes multiple narrowband signals, and a carrier angular frequency of the $i^{th}$ narrowband signal is $w_i$. For example, the transmitted signal includes two narrowband signals, and carrier angular frequencies are $w_1$ and $w_2$, respectively. The sign function sign( ) generally includes: sign(a positive number)=1 and sign(a negative number)=−1. However, there may be varieties of different implementation for sign(0). Let sign(0)=1, −1, or 0. Specially, in some implementation manners, let sign(a number whose absolute value is less than a given value) =0. It should be noted that, a variant implementation manner may be used for the sign function sign( ). For example, sign(a positive number)=−1 and sign(a negative number)=1; or sign(a positive number)=x and sign(a negative number)=y, where x and y are different real numbers.

Specifically, as shown in FIG. 4, a first square wave signal may be sign(sin($w_1 \times t$)), and a second square wave signal may be sign(cos($w_1 \times t$)); or a first square wave signal may be sign(cos($w_1 \times t$)), and a second square wave signal may be sign(sin($w_1 \times t$)).

In addition, the third square wave signal may be sign(sin ($w_2 \times t$)), and the fourth square wave signal may be sign(cos ($w_2 \times t$)); or the third square wave signal may be sign(cos ($w_2 \times t$)), and the fourth square wave signal may be sign(sin ($w_2 \times t$)).

In addition, in the receiver according to this embodiment of the present disclosure, parameters of square wave signals, of low-pass filters, or of analog-to-digital converters of each set of hardware may be the same or may be different. For example, in a case of different parameters, parameters of each set of hardware may be set according to a principle of minimizing a total sampling rate, so as to reduce power consumption. Specifically, in an embodiment, in each set of hardware, bandwidths of a low-pass filter and a low-pass filter may range between (−fs/2, fs/2), sampling rates of an analog-to-digital converter and an analog-to-digital converter may be fs, and minimum frequencies or fundamental frequencies of square wave signals used by frequency mixers may be fp. These parameters may satisfy:

fs=fp and fs>B, where fp is the minimum frequency or the fundamental frequency of the square wave signals.

For example, in the example of FIG. 3, bandwidths of the first low-pass filter 212 and the second low-pass filter 222 range between (−fs/2, fs/2); sampling rates of the first analog-to-digital converter 213 and the second analog-to-digital converter 223 are fs; and fs=fp and fs>B, where fp is a minimum frequency or a fundamental frequency of the first square wave signal or the second square wave signal.

In addition, bandwidths of the third low-pass filter 232 and the fourth low-pass filter 242 range between (−fs/2, fs/2); sampling rates of the third analog-to-digital converter 213 and the fourth analog-to-digital converter 223 are fs; and fs=fp and fs>B, where fp is a minimum frequency or a fundamental frequency of the third square wave signal or the fourth square wave signal, and B is a bandwidth of the third square wave signal or the fourth square wave signal.

Figure 5:
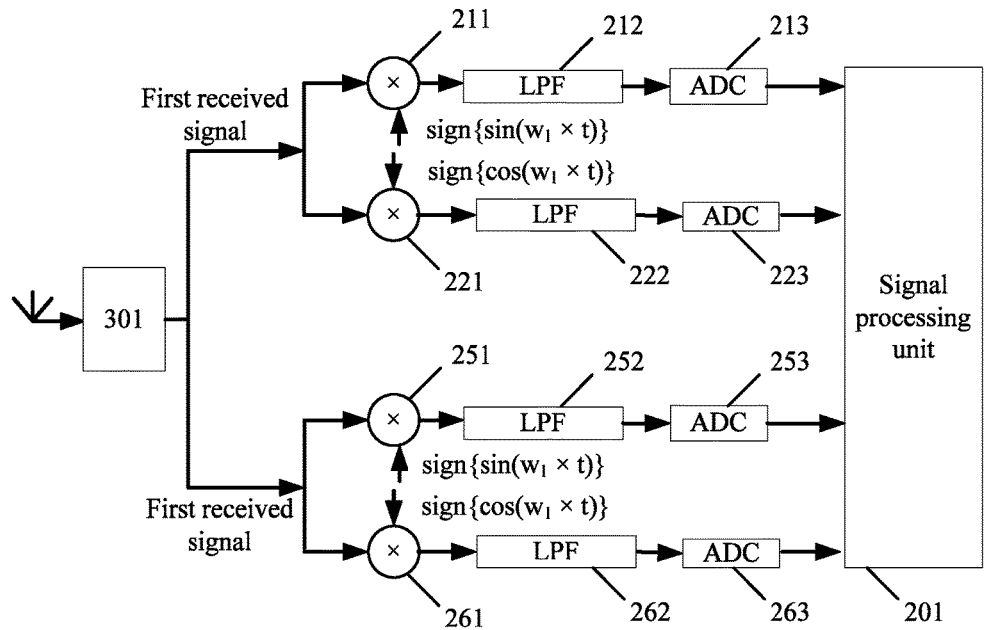
FIG. 5 is a block diagram of a receiver according to another embodiment of the present disclosure.

FIG. 5 is a block diagram of a receiver according to another embodiment of the present disclosure. Devices of the receiver in FIG. 5, which are the same as those in FIG. 2 to FIG. 4, use same reference numerals in the accompanying drawing, and therefore, repeated descriptions are omitted.

As shown in FIG. 5, in addition to a first frequency mixer 211, a first low-pass filter 212, a first analog-to-digital converter 213, a second frequency mixer 221, a second low-pass filter 222, a second analog-to-digital converter 223, and a signal processing unit 201, the receiver in FIG. 5 further includes a fifth frequency mixer 251, a fifth low-pass filter 252, a fifth analog-to-digital converter 253, a sixth frequency mixer 261, a sixth low-pass filter 262, and a sixth analog-to-digital converter 263.

The fifth frequency mixer 251 is configured to perform frequency mixing on a first received signal by using a first square wave signal to obtain a fifth frequency-mixed signal.

The fifth low-pass filter 252 is configured to: receive the fifth frequency-mixed signal from the fifth frequency mixer 251 and perform low-pass filtering on the fifth frequency-mixed signal to obtain a fifth filtered signal.

The fifth analog-to-digital converter 253 is configured to: receive the fifth filtered signal from the fifth low-pass filter 252 and perform analog-to-digital conversion on the fifth filtered signal to obtain a fifth sampled signal.

The sixth frequency mixer 261 is configured to perform frequency mixing on the first received signal by using a second square wave signal to obtain a sixth frequency-mixed signal.

The sixth low-pass filter 262 is configured to: receive the sixth frequency-mixed signal from the sixth frequency mixer 261 and perform low-pass filtering on the sixth frequency-mixed signal to obtain a sixth filtered signal.

The sixth analog-to-digital converter 263 is configured to: receive the sixth filtered signal from the sixth low-pass filter 262 and perform analog-to-digital conversion on the sixth filtered signal to obtain a sixth sampled signal.

The signal processing unit 201 is further configured to: receive the fifth sampled signal from the fifth analog-to-digital converter 253, receive the sixth sampled signal from the sixth analog-to-digital converter 263, and estimate, according to a first sampled signal, a second sampled signal, the fifth sampled signal, and the sixth sampled signal, an information symbol transmitted by a transmit end.

Only an example in which the receiver has two sets of hardware (including four channels of hardware) is described in the embodiment of FIG. 5, and frequencies of received signals processed by all sets of hardware may be the same. The embodiment of FIG. 5 may be extended similarly to a case in which there are more sets of hardware. Such extension still falls within the scope of this embodiment of the present disclosure.

Optionally, in an embodiment, the square wave signals used in this embodiment of the present disclosure may be sign(sin(wi×t)) and sign(cos(wi×t)), where wi is a carrier angular frequency of a received signal, wi=fi×2π, i is a positive integer, sign( ) is a sign function, and t represents a time.

Specifically, as shown in FIG. 5, the first square wave signal may be sign(sin(w1×t)), and the second square wave signal may be sign(cos(w1×t)), and vice versa.

In addition, in the receiver according to this embodiment of the present disclosure, parameters of square wave signals, of low-pass filters, or of analog-to-digital converters of each set of hardware may be the same or may be different. For example, in a case of different parameters, parameters of each set of hardware may be set according to a principle of minimizing a total sampling rate, so as to reduce power consumption. Specifically, in an embodiment, in each set of hardware, bandwidths of a low-pass filter and a low-pass filter may range between (−fs/2, fs/2), sampling rates of an analog-to-digital converter and an analog-to-digital converter may be fs, and minimum frequencies or fundamental frequencies of square wave signals used by frequency mixers may be fp. These parameters may satisfy:

fs=fp and fs>B, where fp is the minimum frequency or the fundamental frequency of the square wave signals.

For example, in the example of FIG. 5, bandwidths of the first low-pass filter 212, the second low-pass filter 222, the fifth low-pass filter 252, and the sixth low-pass filter 262 range between (−fs/2, fs/2); sampling rates of the first analog-to-digital converter 213, the second analog-to-digital converter 223, the fifth analog-to-digital converter 253, and the sixth analog-to-digital converter 263 are fs; and fs=fp and fs>B, where fp is a minimum frequency or a fundamental frequency of the first square wave signal or the second square wave signal.

Different hardware channels are used to process one received signal, which can improve receiving performance and avoid hardware idling.

Optionally, in another embodiment, the first received signal may further include a narrowband signal whose carrier frequency is f3, and f1≠f3. In other words, a carrier frequency estimation value of the first received signal may include f1 and f3. In this case, the signal processing unit 201 in FIG. 2 to FIG. 5 may further estimate, according to a first sampled signal and a second sampled signal, an information symbol transmitted at the carrier frequency f3. In this case, in a specific implementation manner, a first pseudo random sequence may be obtained by a digital device by performing quantization processing on a sine signal (or a cosine signal) that is based on the frequency f1 and a sine signal (or a cosine signal) that is based on the frequency f3, and a second pseudo random sequence may be obtained by the digital device by performing quantization processing on a cosine signal (or a sine signal) that is based on the frequency f1 and a cosine signal (or a sine signal) that is based on the frequency f3.

In this way, less hardware can be used to process received signals on more frequency bands. Therefore, hardware is reduced.

The foregoing embodiment may be extended to a case in which a received signal involves more carrier frequencies. According to the foregoing manner, a quantity of hardware channels required for M narrow bands may be decreased from 2M to 2M/p (herein, p=3, 5, 7 . . . ) in this embodiment of the present disclosure. Specially, if the received signal includes a maximum of K narrow bands in the M narrow bands, the receiver according to this embodiment of the present disclosure may need hardware having only 2K/p channels. Therefore, hardware overheads can be further reduced.

Figure 6:
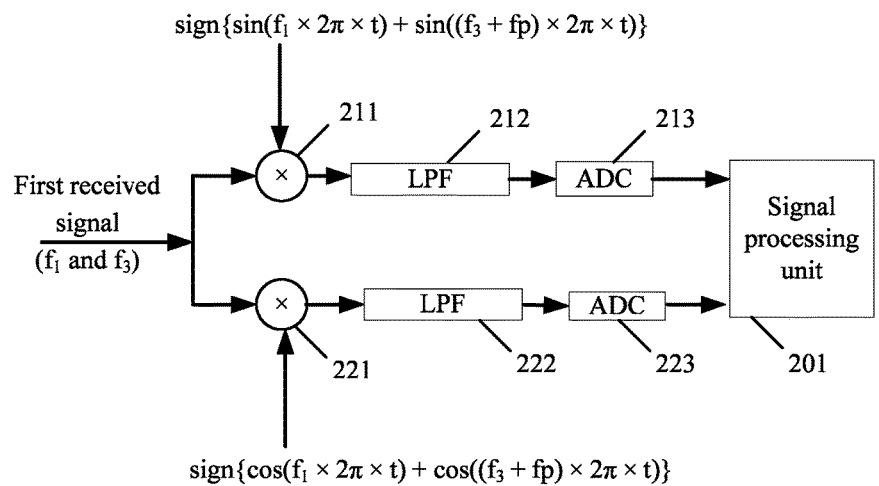
FIG. 6 is a block diagram of a receiver according to another embodiment of the present disclosure.

FIG. 6 is a block diagram of a receiver according to another embodiment of the present disclosure. Devices of the receiver in FIG. 6, which are the same as those in FIG. 2 to FIG. 5, use same reference numerals in the accompanying drawing, and therefore, repeated descriptions are omitted.

In the embodiment of FIG. 6, a first square wave signal is sign{sin(f1×2πxt)+sin((f3+fp)×2πxt)}, and a second square wave signal is sign{cos(f1×2πxt)+cos((f3+fp) ×2πxt)}.

Herein, sign is a sign function, t represents a time, fp is a minimum frequency or a fundamental frequency of the first square wave signal or the second square wave signal, and f1≠f3.

In addition, the first square wave signal and the second square wave signal are interchangeable, that is, the first square wave signal is sign{cos(f1×2πxt)+cos((f3+fp)×2πx t)}, and the second square wave signal is sign{sin(f1×2πx t)+sin((f3+fp)×2πxt)}.

Figure 7:
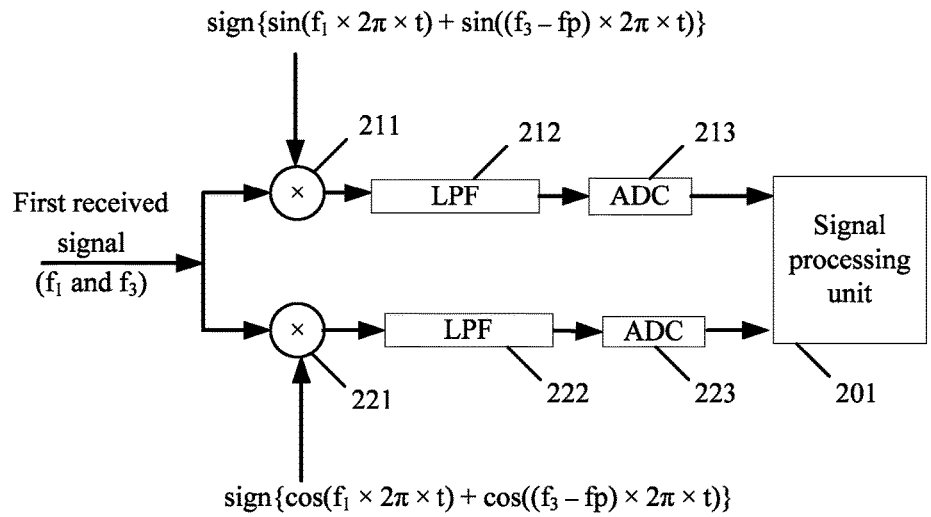
FIG. 7 is a block diagram of a receiver according to another embodiment of the present disclosure.

FIG. 7 is a block diagram of a receiver according to another embodiment of the present disclosure. Devices of the receiver in FIG. 7, which are the same as those in FIG.

2 to FIG. 6, use same reference numerals in the accompanying drawing, and therefore, repeated descriptions are omitted.

In the embodiment of FIG. 7, a first square wave signal is sign{sin(f1×2πxt)+sin((f3−fp)×2πx)}, and a square wave signal corresponding to a second square wave signal is sign{cos(f1×2πxt)+cos((f3−fp)×2πxt)}.

Herein, sign is a sign function, t represents a time, fp is a minimum frequency or a fundamental frequency of the first square wave signal or the second square wave signal, and f1≠f3.

In addition, the first square wave signal and the second square wave signal are interchangeable, that is, the first square wave signal is sign{cos(f1×2πxt)+cos((f3−fp)×2πxt)}, and the second square wave signal is sign{sin(f1×2πxt)+sin((f3−fp)×2πxt)}.

Figure 8:
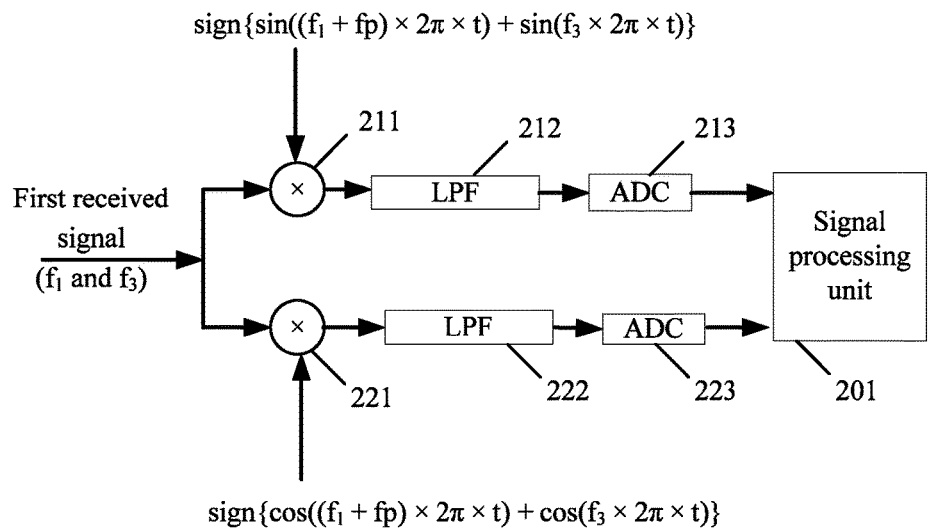
FIG. 8 is a block diagram of a receiver according to another embodiment of the present disclosure.

FIG. 8 is a block diagram of a receiver according to another embodiment of the present disclosure. Devices of the receiver in FIG. 8, which are the same as those in FIG. 2 to FIG. 7, use same reference numerals in the accompanying drawing, and therefore, repeated descriptions are omitted.

In the embodiment of FIG. 8, a first square wave signal is sign{sin((f1+fp)×2πxt)+sin(f3×2πxt)}, and a second square wave signal is sign{cos((f1+fp)×2πxt)+cos(f3×2πxt)}.

Herein, sign is a sign function, t represents a time, fp is a minimum frequency or a fundamental frequency of the first square wave signal or the second square wave signal, that is, a reciprocal of a minimum period of the periodic first square wave signal or second square wave signal, and f1≠f3.

In addition, the first square wave signal and the second square wave signal are interchangeable, that is, the first square wave signal is sign{cos((f1+fp)×2πxt)+cos(f3×2πxt)}, and the second square wave signal is sign{sin((f1+fp)×2πxt)+sin(f3×2πxt)}.

Figure 9:
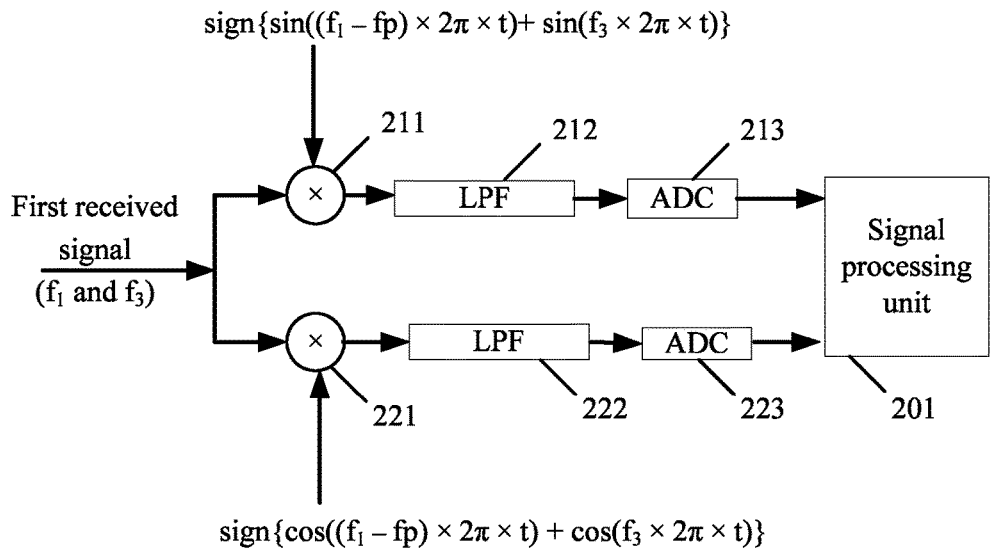
FIG. 9 is a block diagram of a receiver according to another embodiment of the present disclosure.

FIG. 9 is a block diagram of a receiver according to another embodiment of the present disclosure. Devices of the receiver in FIG. 9, which are the same as those in FIG. 2 to FIG. 8, use same reference numerals in the accompanying drawing, and therefore, repeated descriptions are omitted.

In the embodiment of FIG. 9, a first square wave signal is sign{sin((f1−fp)×2πxt)+sin(f3×2πxt)}, and a second square wave signal is sign{cos((f1−fp)×2πxt)+cos(f3×2πxt)}.

Herein, sign is a sign function, t represents a time, fp is a minimum frequency or a fundamental frequency of the first square wave signal or the second square wave signal, and f1≠f3.

In addition, the first square wave signal and the second square wave signal are interchangeable, that is, the first square wave signal is sign{cos((f1−fp)×2πxt)+cos(f3×2πxt)}, and the second square wave signal is sign{sin((f1−fp)×2πxt)+sin(f3×2πxt)}.

Figure 10:
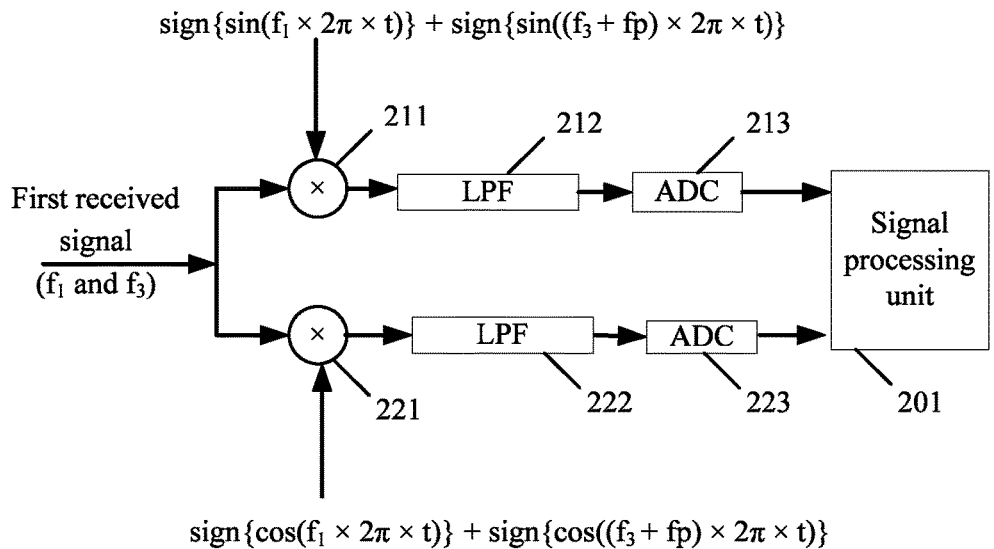
FIG. 10 is a block diagram of a receiver according to another embodiment of the present disclosure.

FIG. 10 is a block diagram of a receiver according to another embodiment of the present disclosure. Devices of the receiver in FIG. 10, which are the same as those in FIG. 2 to FIG. 9, use same reference numerals in the accompanying drawing, and therefore, repeated descriptions are omitted.

In the embodiment of FIG. 10, a first square wave signal is sign{sin(f1×2πxt)}+sign{sin((f3+fp)×2πxt)}, and a second square wave signal is sign{cos(f1×2πxt)}+sign{cos((f3+fp)×2πxt)}.

Herein, sign is a sign function, t represents a time, fp is a minimum frequency or a fundamental frequency of the first square wave signal or the second square wave signal, and f1≠f3.

In addition, the first square wave signal and the second square wave signal are interchangeable, that is, the first square wave signal is sign{cos(f1×2πxt)}+sign{cos((f3+fp)×2πxt)}, and the second square wave signal is sign{sin(f1×2πxt)}+sign{sin((f3+fp)×2πxt)}.

Figure 11:
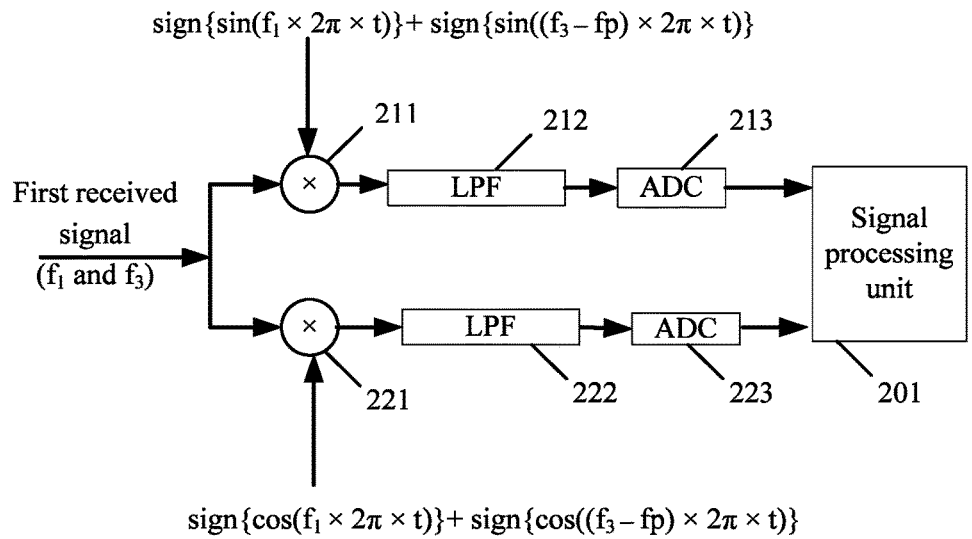
FIG. 11 is a block diagram of a receiver according to another embodiment of the present disclosure.

FIG. 11 is a block diagram of a receiver according to another embodiment of the present disclosure. Devices of the receiver in FIG. 11, which are the same as those in FIG. 2 to FIG. 10, use same reference numerals in the accompanying drawing, and therefore, repeated descriptions are omitted.

In the embodiment of FIG. 11, a first square wave signal is sign{sin(f1×2πxt)}+sign{sin((f3−fp)×2πxt)}, and a second square wave signal is sign{cos(f1×2πxt)}+sign{cos((f3−fp)×2πxt)}.

Herein, sign is a sign function, t represents a time, fp is a minimum frequency or a fundamental frequency of the first square wave signal or the second square wave signal, and f1≠f3.

In addition, the first square wave signal and the second square wave signal are interchangeable, that is, the first square wave signal is sign{cos(f1×2πxt)}+sign{cos((f3−fp)×2πxt)}, and the second square wave signal is sign{sin(f1×2πxt)}+sign{sin((f3−fp)×2πxt)}.

Figure 12:
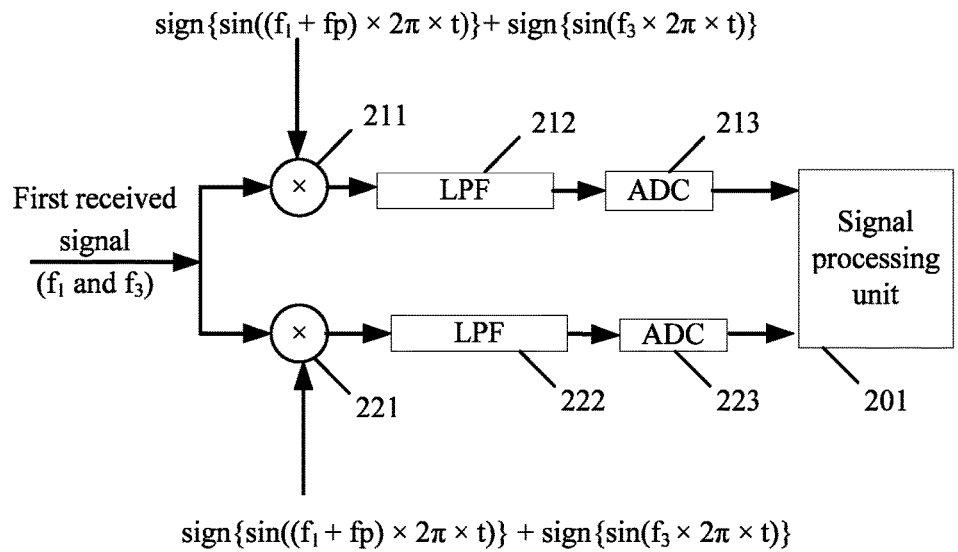
FIG. 12 is a block diagram of a receiver according to another embodiment of the present disclosure.

FIG. 12 is a block diagram of a receiver according to another embodiment of the present disclosure. Devices of the receiver in FIG. 12, which are the same as those in FIG. 2 to FIG. 11, use same reference numerals in the accompanying drawing, and therefore, repeated descriptions are omitted.

In the embodiment of FIG. 12, a first square wave signal is sign{sin((f1+fp)×2πxt)}+sign{sin(f3×2πxt)}, and a second square wave signal is sign{cos((f1+fp)×2πxt}+sign{cos(f3×2πxt)}.

Herein, sign is a sign function, t represents a time, fp is a minimum frequency or a fundamental frequency of the first square wave signal or the second square wave signal, and f1≠f3.

In addition, the first square wave signal and the second square wave signal are interchangeable, that is, the first square wave signal is sign{cos((f1+fp)×2πxt}+sign{cos(f3×2πxt)}, and the second square wave signal is sign{sin((f1+fp)×2πxt)}+sign{sin(f3×2πxt)}.

Figure 13:
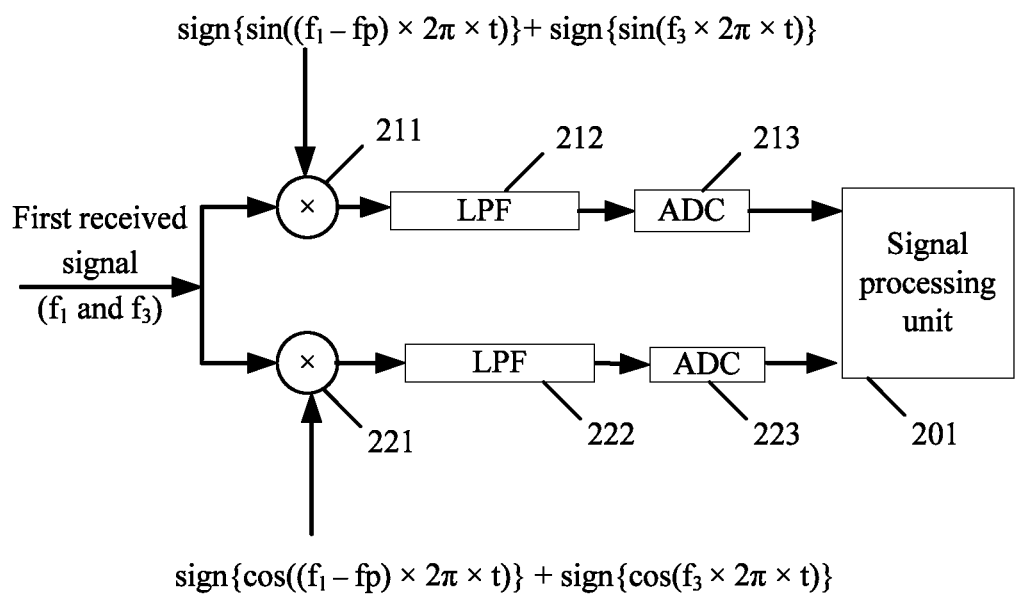
FIG. 13 is a block diagram of a receiver according to another embodiment of the present disclosure.

FIG. 13 is a block diagram of a receiver according to another embodiment of the present disclosure. Devices of the receiver in FIG. 13, which are the same as those in FIG. 2 to FIG. 12, use same reference numerals in the accompanying drawing, and therefore, repeated descriptions are omitted.

In the embodiment of FIG. 13, a first square wave signal is sign{sin((f1−fp)×2πxt)}+sign{sin(f3×2πxt)}, and a second square wave signal is sign{cos((f1−fp)×2πxt)}+sign{cos(f3×2πxt)}.

Herein, sign is a sign function, t represents a time, fp is a minimum frequency or a fundamental frequency of the first square wave signal or the second square wave signal, and f1≠f3.

In addition, the first square wave signal and the second square wave signal are interchangeable, that is, the first square wave signal is sign{cos((f1−fp)×2πxt)}+sign{cos(f3×2πxt)}, and the second square wave signal is sign{sin((f1−fp)×2πxt)}+sign{sin(f3×2πxt)}.

In the embodiments of FIG. 6 to FIG. 13, a sampling rate of an ADC may be increased, so that a decreased quantity of channels does not affect signal processing quality.

For example, in the embodiments of FIG. 6 to FIG. 13, bandwidths of a first low-pass filter 212 and a second low-pass filter 222 may range between (−fs×1.5, fs×1.5), sampling rates of a first analog-to-digital converter 213 and a second analog-to-digital converter 223 may be 3×fs, and a minimum frequency or a fundamental frequency of the first square wave signal or the second square wave signal may be fp. These parameters satisfy:

fs=fp and fs>B.

In the embodiments of FIG. 6 to FIG. 13, at least two hardware channels are used. In practice, there may be an embodiment in which only one hardware channel is used. For example, when a transmitted signal is a narrowband signal whose carrier angular frequency is $w_1$, only one hardware channel may be used. This hardware channel is similar to a first hardware channel in the embodiments of FIG. 6 to FIG. 13. That is, the bandwidth of the first low-pass filter 212 may range between (−fs×1.5, fs×1.5), the sampling rate of the first analog-to-digital converter 213 may be 3×fs, the minimum frequency or the fundamental frequency of the first square wave signal may be fp. These parameters satisfy:

fs=fp and fs>B. In this case, the first square wave signal may be set to sign{sin($f_1$×2πxt)+cos(($f_1$+fp)×2πxt)} or another similar form.

Optionally, a digital device that is configured to generate a square wave signal in the embodiments of the present disclosure may include a shift register (shift register), and, for example, may be implemented by using a standard shift register (standard shift register). The digital device may be located in the receiver, or located outside the receiver. The standard shift register may be configured to generate a pseudo random sequence, for example, an m-sequence. In addition, for the digital device according to the embodiments of the present disclosure, some memories (memory) may be added to the standard shift register to support a relatively complex pseudo random sequence. It is well known that, a corresponding pseudo random sequence may be changed by changing a value stored in the standard shift register, thereby finally changing a square wave used for frequency mixing.

In addition, in the embodiments of FIG. 10 to FIG. 13, a pseudo random sequence of each square wave signal may be implemented by summing waveforms generated by two standard shift registers, or may be implemented by one standard shift register and a corresponding caching device (for example, a memory).

Optionally, in another embodiment, when there are at least two frequency bands for a received signal that needs to be processed, the signal processing unit in FIG. 2 to FIG. 13 may process sampled signals obtained by each set of hardware in a centralized manner, to eliminate or mitigate impact of mutual interference between all frequency bands on receiving performance.

Specifically, a matrix As reflecting a relationship between a valid (that is, non-zero) component Xs of a to-be-sampled signal spectrum and a sequence spectrum Y sampled by an ADC may be constructed according to a pseudo random sequence and a frequency range to which each frequency band belongs. Xs is estimated according to (AsHAs)−1AsHY.

Considering impact of noise, Xs may be estimated according to (AsHAs+αI)−1AsHY. In this way, receiving performance can be improved. Herein, α is a ratio of noise power to signal power, and I is an identity matrix.

A to-be-received transmitted signal may be a QAM (Quadrature Amplitude Modulation, quadrature amplitude modulation) symbol on each subcarrier. An interference cancellation technology may be further used. A subband having an optimum receiving SNR (Signal-to-Noise Ratio, signal-to-noise ratio) is found first to obtain its estimation value. Then, hard decision is performed based on the estimation value. Next, impact of the frequency band is eliminated in Y by using a hard-decision result. Finally, another frequency band is received. Processes are performed successively in this way.

A maximum likelihood algorithm may be used by a signal processing unit 201. However, the embodiments of the present disclosure are not limited thereto, and another approximation algorithm may also be used.

Generally, it is assumed that white noise is outside each frequency band. When there is interference outside each frequency band, if a matrix Ru reflecting statistics characteristics of noise and interference is known, in the known prior art, Xs may be estimated according to (AsHAs+Ru)−1AsHY. In this way, receiving performance can be improved.

In addition, according to the embodiments of the present disclosure, when an amount of hardware is more than twice a quantity of frequency bands for a received signal, narrowband interference can be further suppressed. Specifically, when a frequency at which the narrowband interference occurs is known, corresponding As2 included in the narrowband interference may be obtained directly, and the receiver according to the embodiments of the present disclosure is then used. Because there are various corresponding signal processing algorithms, a person skilled in the art can easily provide a corresponding design.

After a sampled value is obtained by using a receiving apparatus described in the present disclosure, multiple sampled values are generally combined, and a required transmitted signal is estimated by using a corresponding signal processing and receiving algorithm. There are various manners of the signal processing and receiving algorithm, which are known to a person skilled in the art. Specially, in some cases, a corresponding narrowband signal in the transmitted signal may be estimated by using a sampled value of one ADC.

Figure 14:
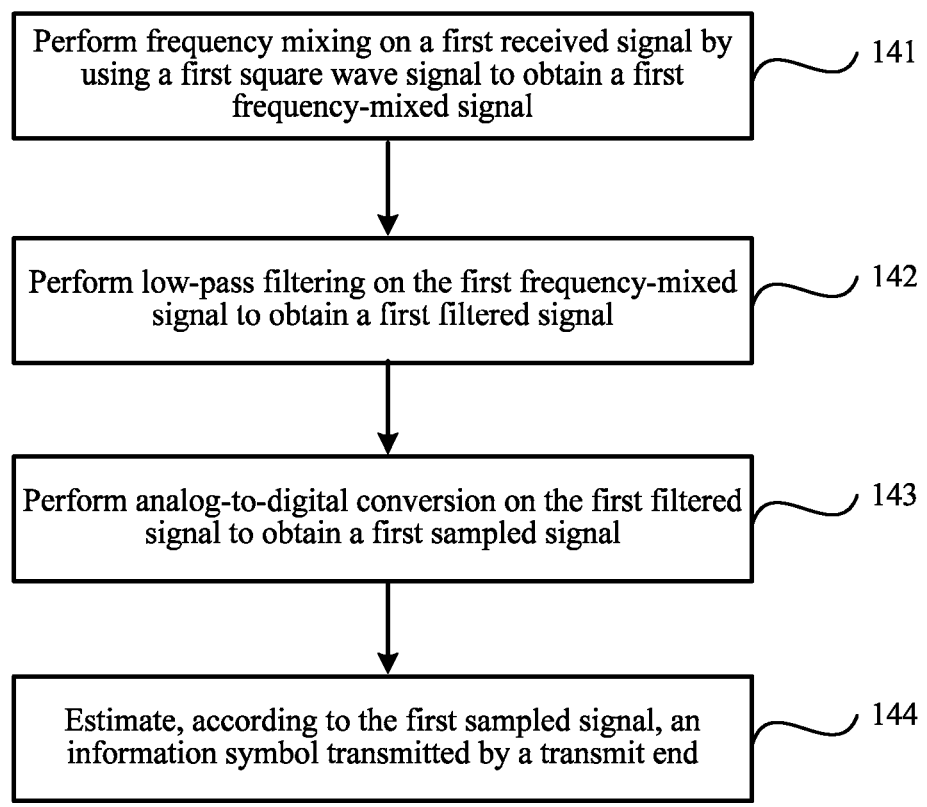
FIG. 14 is a flowchart of a receiving method according to an embodiment of the present disclosure.

FIG. 14 is a flowchart of a receiving method according to an embodiment of the present disclosure. The receiving method of FIG. 14 may be executed by the receiver in FIG. 2.

141: Perform frequency mixing on a first received signal by using a first square wave signal to obtain a first frequency-mixed signal.

142: Perform low-pass filtering on the first frequency-mixed signal to obtain a first filtered signal.

143: Perform analog-to-digital conversion on the first filtered signal to obtain a first sampled signal.

144: Estimate, according to the first sampled signal, an information symbol transmitted by a transmit end.

The first square wave signal is generated according to a carrier frequency estimation value of the first received signal.

The receiver according to this embodiment of the present disclosure performs frequency mixing on a received signal by using a square wave signal. In this way, because the square wave signal may be set as needed, the receiver according to this embodiment of the present disclosure provides better flexibility.

Specifically, a frequency mixer used in this embodiment of the present disclosure uses a square wave signal, which is different from a conventional frequency mixer that uses a monophonic signal for frequency mixing. Moreover, an analog device is used in the conventional frequency mixer. Parameters of this analog device are difficult to adjust after configuration. On the contrary, a digital device is used in this embodiment of the present disclosure to generate the square wave signal required for frequency mixing, and the square wave signal can be set flexibly as needed.

For example, the receiver according to this embodiment of the present disclosure can be configured for a varying frequency band by including only one set of hardware (two frequency mixers, a low-pass filter, and an analog-to-digital converter). In other words, even if a frequency band for the received signal changes, the hardware does not need to be replaced, as long as the square wave signal generated by the digital device is adjusted. For example, when a frequency band used by an operator changes, or available frequency bands increase, the receiver according to this embodiment of the present disclosure can still be used without the need of replacing hardware. In this way, costs can be reduced.

For another example, when a quantity K' of frequency bands selected and used by the transmit end at a moment is less than an amount K of hardware in the receiver, the receiver according to this embodiment of the present disclosure may use 2K channels (more than 2K' channels) to receive signals on the K' frequency bands. In this way, receiving performance can be improved.

In addition, because the square wave signal includes multiple monophonic (that is, multiple carriers) signals, an amount of hardware in the receiver may be further reduced according to this embodiment of the present disclosure. For example, a quantity of hardware channels required for M narrow bands may be decreased from 2M to 2M/p (herein, p=3, 5, 7 . . . ). Specially, if the received signal includes a maximum of K narrow bands in the M narrow bands, the receiver according to this embodiment of the present disclosure may need hardware having only 2K/p channels. Therefore, hardware overheads can be further reduced.

The method according to this embodiment of the present disclosure may include operations corresponding to all components of the receivers in FIG. 2 to FIG. 13. To avoid repetition, details are not described herein again.

Figure 15:
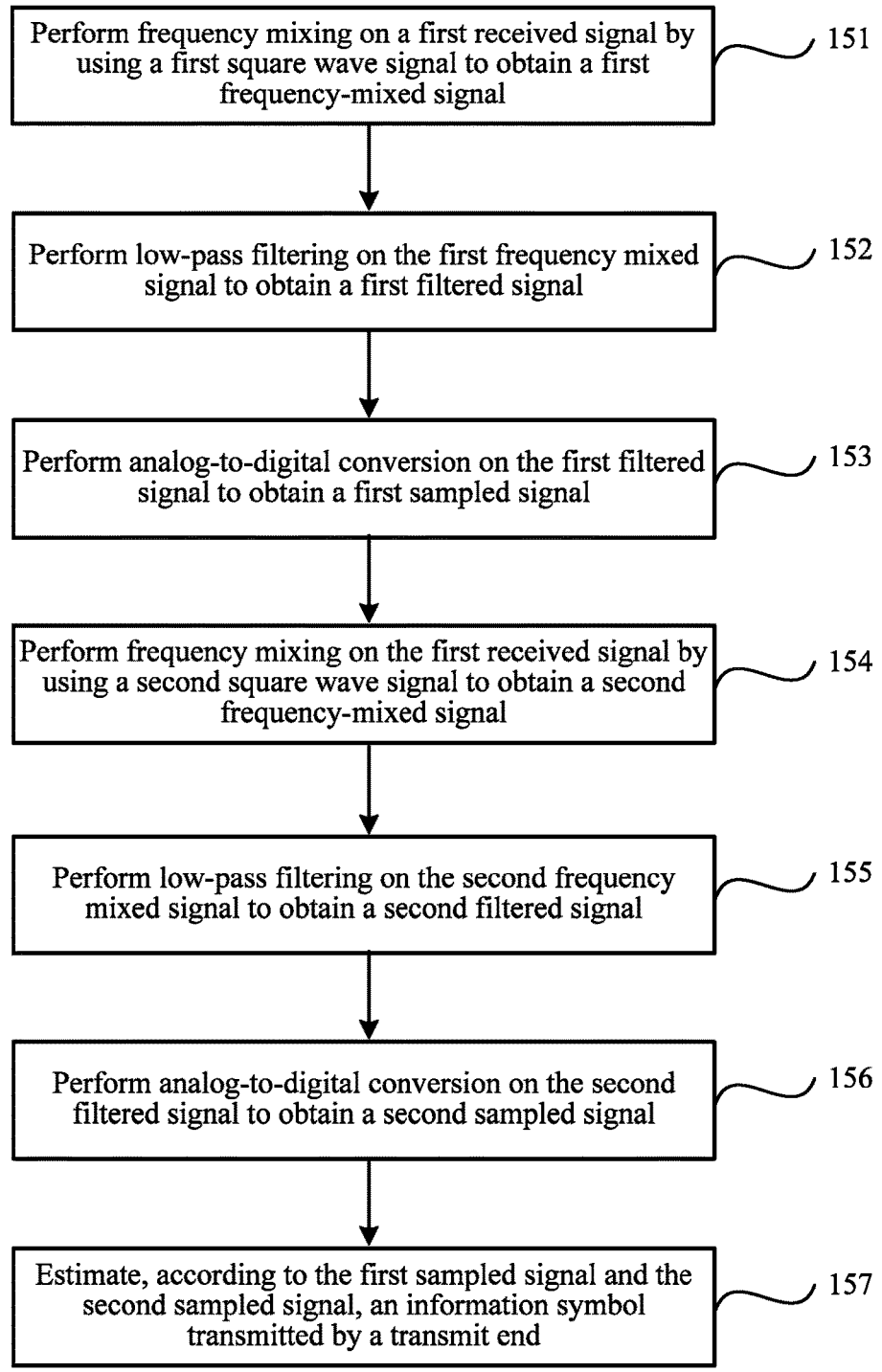
FIG. 15 is a flowchart of a receiving method according to another embodiment of the present disclosure.

FIG. 15 is a flowchart of a receiving method according to another embodiment of the present disclosure. The receiving method of FIG. 15 may be executed by the receivers in FIG. 3 to FIG. 13.

151: Perform frequency mixing on a first received signal by using a first square wave signal to obtain a first frequency-mixed signal.

152: Perform low-pass filtering on the first frequency-mixed signal to obtain a first filtered signal.

153: Perform analog-to-digital conversion on the first filtered signal to obtain a first sampled signal.

154: Perform frequency mixing on the first received signal by using a second square wave signal to obtain a second frequency-mixed signal.

155: Perform low-pass filtering on the second frequency-mixed signal to obtain a second filtered signal.

156: Perform analog-to-digital conversion on the second filtered signal to obtain a second sampled signal.

157: Estimate, according to the first sampled signal and the second sampled signal, an information symbol transmitted by a transmit end.

Herein, the first square wave signal and the second square wave signal are generated according to a carrier frequency estimation value (for example, represented as f1 or w1) of the first received signal.

The receiver according to this embodiment of the present disclosure performs frequency mixing on a received signal by using a square wave signal. In this way, because the square wave signal may be set as needed, the receiver according to this embodiment of the present disclosure provides better flexibility.

A numbering sequence of the foregoing steps does not constitute a limitation on the scope of this embodiment of the present disclosure. For example, step 151 to step 153 may be executed before step 154 and step 155, or may be executed after step 154 and step 155, or may be executed in parallel with step 154 and step 155.

Optionally, in another embodiment, in the signal processing method according to this embodiment of the present disclosure, frequency mixing may be further performed on a second received signal by using a third square wave signal to obtain a third frequency-mixed signal; low-pass filtering may be performed on the third frequency-mixed signal to obtain a third filtered signal; analog-to-digital conversion may be performed on the third filtered signal to obtain a third sampled signal; the second received signal may be frequency-mixed with a fourth square wave signal to obtain a fourth frequency-mixed signal; low-pass filtering may be performed on the fourth frequency-mixed signal to obtain a fourth filtered signal; and analog-to-digital conversion may be performed on the fourth filtered signal to obtain a fourth sampled signal. In this case, in step 144 or step 157, the information symbol transmitted by the transmit end may be estimated according to the first sampled signal, the second sampled signal, the third sampled signal, and the fourth sampled signal. Herein, the third square wave signal and the fourth square wave signal are generated according to a carrier frequency estimation value of the second received signal, and the carrier frequency estimation value of the first received signal is different from the carrier frequency estimation value of the second received signal (that is, f1≠f2, or w1≠w2).

Optionally, in another embodiment, the square wave signals used in this embodiment of the present disclosure may be $sign(sin(w_i \times t))$ and $sign(cos(w_i \times t))$, where wi is a carrier angular frequency of a narrowband signal in a transmitted signal including multiple narrowband signals, $w_i = f_i \times 2\pi$, i is a positive integer, sign( ) is a sign function, and t represents a time. Generally, a transmitted signal in communication includes multiple narrowband signals, and a carrier angular frequency of the ith narrowband signal is wi. For example, the transmitted signal includes two narrowband signals, and carrier angular frequencies are w1 and w2, respectively. The sign function sign( ) generally includes: sign(a positive number)=1 and sign(a negative number)=−1, However, there may be varieties of different implementation for sign(0). Let sign(0)=1, −1, or 0. Specially, in some implementation manners, let sign(a number whose absolute value is less than a given value)=0. It should be noted that, a variant implementation manner may be used for the sign function sign( ). For example, sign(a positive number)=−1 and sign(a negative number)=1; or sign(a positive number)=x and sign(a negative number)=y, where x and y are different real numbers.

Specifically, the first square wave signal may be sign(sin (w1×t)), and the second square wave signal may be sign (cos(w1×t)); or the first square wave signal is sign(cos(f1× 2π×t)), and the second square wave signal is sign(sin(f1× 2π×t)).

In addition, the third square wave signal may be sign(sin (w2×t)), and the fourth square wave signal may be sign(cos (w2×t)); or the third square wave signal is sign(cos(f2×2π× t)), and the fourth square wave signal is sign(sin(f2×2π×t)).

Optionally, in another embodiment, the first received signal may further include a narrowband signal whose carrier frequency is f3, and f1≠f3. In other words, the carrier frequency estimation value of the first received signal may include f1 and f3. In this case, an information symbol transmitted at the carrier frequency f3 may be further estimated according to the first sampled signal and the second sampled signal. A pseudo random sequence corresponding to the first square wave signal is obtained by a digital device by performing sign function processing on a sine signal that is based on the frequency f1 and a sine signal that is based on the frequency f3, and a pseudo random sequence corresponding to the second square wave signal is obtained by the digital device by performing sign function processing on a cosine signal that is based on the frequency f1 and a cosine signal that is based on the frequency f3. This embodiment may be extended to a case in which a received signal involves more carrier frequencies.

Optionally, in another embodiment, the first square wave signal is sign{ sin(f1×2πxt)+sin((f3+fp)×2πxt)}, and the second square wave signal is sign{ cos(f1×2πxt)+cos((f3+fp)×2πxt)}.

In addition, the first square wave signal and the second square wave signal are interchangeable, that is, the first square wave signal is sign{ cos(f1×2πxt)+cos((f3+fp)×2πxt)}, and the second square wave signal is sign{ sin(f1×2πxt)+sin((f3+fp)×2πxt)}.

Optionally, in another embodiment, the first square wave signal is sign{ sin(f1×2πxt)+sin((f3−fp)×2πxt)}, and the second square wave signal is sign{ cos(f1×2πxt)+cos((f3−fp)×2πxt)}.

In addition, the first square wave signal and the second square wave signal are interchangeable, that is, the first square wave signal is sign{ cos(f1×2πxt)+cos((f3−fp)×2πxt)}, and the second square wave signal is sign{ sin(f1×2πxt)+sin((f3−fp)×2πxt)}.

Optionally, in another embodiment, the first square wave signal is sign{ sin((f1+fp)×2πxt)+sin(f3×2πxt)}, and the second square wave signal is sign{ cos((f1+fp)×2πxt)+cos(f3×2πxt)}.

In addition, the first square wave signal and the second square wave signal are interchangeable, that is, the first square wave signal is sign{ cos((f1+fp)×2πxt)+cos(f3×2πxt)}, and the second square wave signal is sign{ sin((f1+fp)×2πxt)+sin(f3×2πxt)}.

Optionally, in another embodiment, the first square wave signal is sign{ sin((f1−fp)×2πxt)+sin(f3×2πxt)}, and the second square wave signal is sign{ cos((f1−fp)×2πxt)+cos(f3×2πxt)}.

In addition, the first square wave signal and the second square wave signal are interchangeable, that is, the first square wave signal is sign{ cos((f1−fp)×2πxt)+cos(f3×2πxt)}, and the second square wave signal is sign{ sin((f1−fp)×2πxt)+sin(f3×2πxt)}.

Optionally, in another embodiment, the first square wave signal is sign{ sin(f1×2πxt)}+sign{ sin((f3+fp)×2πxt)}, and the second square wave signal is sign{ cos(f1×2πxt)}+sign{ cos((f3+fp)×2πxt)}.

In addition, the first square wave signal and the second square wave signal are interchangeable, that is, the first square wave signal is sign{ cos(f1×2πxt)}+sign{ cos((f3+fp)×2πxt)}, and the second square wave signal is sign{ sin(f1×2πxt)}+sign{ sin((f3+fp) ×2πxt)}.

Optionally, in another embodiment, the first square wave signal is sign{ sin(f1×2πxt)}+sign{ sin((f3−fp)×2πxt)}, and the second square wave signal is sign{ cos(f1×2πxt)}+sign{ cos((f3−fp)×2πxt)}.

In addition, the first square wave signal and the second square wave signal are interchangeable, that is, the first square wave signal is sign{ cos(f1×2πxt)}+sign{ cos((f3−fp)×2πxt)}, and the second square wave signal is sign{ sin(f1×2πxt)}+sign{ sin((f3−fp)×2πxt)}.

Optionally, in another embodiment, the first square wave signal is sign{ sin((f1+fp)×2πxt)}+sign{ sin(f3×2πxt)}, and the second square wave signal is sign{ cos((f1+fp)×2πxt)}+sign{ cos(f3×2πxt)}.

In addition, the first square wave signal and the second square wave signal are interchangeable, that is, the first square wave signal is sign{ cos((f1+fp)×2πxt)}+sign{ cos(f3×2πxt)}, and the second square wave signal is sign{ sin((f1+fp)×2πxt)}+sign{ sin(f3×2πxt)}.

Optionally, in another embodiment, the first square wave signal is sign{ sin((f1−fp)×2πxt)}+sign{ sin(f3×2πxt)}, and the second square wave signal is sign{ cos((f1−fp)×2πxt)}+sign{ cos(f3×2πxt)}.

In addition, the first square wave signal and the second square wave signal are interchangeable, that is, the first square wave signal is sign{ cos((f1−fp)×2πxt)}+sign{ cos(f3×2πxt)}, and the second square wave signal is sign{ sin((f1−fp)×2πxt)}+sign{ sin(f3×2πxt)}.

Herein, sign is a sign function, t represents a time, fp is a minimum frequency or a fundamental frequency of the first square wave signal or the second square wave signal, that is, a reciprocal of a minimum period of the periodic first square wave signal or second square wave signal.

Optionally, in another embodiment, frequency mixing may be performed on the first received signal by using the first square wave signal to obtain a fifth frequency-mixed signal; low-pass filtering may be performed on the fifth frequency-mixed signal to obtain a fifth filtered signal; analog-to-digital conversion may be performed on the fifth filtered signal to obtain a fifth sampled signal; the first received signal may be frequency-mixed with the second square wave signal to obtain a sixth frequency-mixed signal; low-pass filtering may be performed on the sixth frequency-mixed signal to obtain a sixth filtered signal; and analog-to-digital conversion may be performed on the sixth filtered signal to obtain a sixth sampled signal. In this case, in step 144 or step 157, the information symbol transmitted by the transmit end is estimated according to the first sampled signal, the second sampled signal, the fifth sampled signal, and the sixth sampled signal.

In this way, different hardware channels may be used to process one received signal, which can improve receiving performance and avoid hardware idling.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is only exemplary. For example, the unit division is only logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present disclosure essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of the present disclosure. The foregoing storage medium includes: any medium that can store program code, such as a USB flash drive, a removable hard disk, a read-only memory (ROM), a random access memory (RAM), a magnetic disk, or an optical disc.

The foregoing descriptions are only specific implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A receiver, comprising:
   a first frequency mixer, configured to perform frequency mixing on a first received signal by using a first square wave signal to obtain a first frequency-mixed signal, wherein the first square wave signal is based on a carrier frequency estimation value of the first received signal;
   a first low-pass filter, configured to receive the first frequency-mixed signal from the first frequency mixer and perform low-pass filtering on the first frequency-mixed signal to obtain a first filtered signal;
   a first analog-to-digital converter, configured to receive the first filtered signal from the first low-pass filter and perform analog-to-digital conversion on the first filtered signal to obtain a first sampled signal;
   a second frequency mixer, configured to perform frequency mixing on the first received signal by using a second square wave signal to obtain a second frequency-mixed signal, wherein the second square wave signal is based on the carrier frequency estimation value of the first received signal;
   a second low-pass filter, configured to receive the second frequency-mixed signal from the second frequency mixer and perform low-pass filtering on the second frequency-mixed signal to obtain a second filtered signal; and
   a second analog-to-digital converter, configured to receive the second filtered signal from the second low-pass filter and perform analog-to-digital conversion on the second filtered signal to obtain a second sampled signal; and
   a processor configured to receive the first sampled signal from the first analog-to-digital converter and receive the second sampled signal from the second analog-to-digital converter, and estimate, according to the first sampled signal and the second sampled signal, an information symbol transmitted by a transmit end,
   wherein:
   the first square wave signal is $sign(sin(f_1 \times 2\pi \times t))$, and the second square wave signal is $sign(cos(f_1 \times 2\pi \times t))$; or
   the first square wave signal is $sign(cos(f_1 \times 2\pi \times t))$, and the second square wave signal is $sign(sin(f_1 \times 2\pi \times t))$,
   wherein sign is a sign function, t represents a time, and $f_1$ is the carrier frequency estimation value of the first received signal.

2. The receiver according to claim 1, further comprising:
   a third frequency mixer, configured to perform frequency mixing on a second received signal by using a third square wave signal to obtain a third frequency-mixed signal;
   a third low-pass filter, configured to receive the third frequency-mixed signal from the third frequency mixer and perform low-pass filtering on the third frequency-mixed signal to obtain a third filtered signal;
   a third analog-to-digital converter, configured to receive the third filtered signal from the third low-pass filter and perform analog-to-digital conversion on the third filtered signal to obtain a third sampled signal;
   a fourth frequency mixer, configured to perform frequency mixing on the second received signal by using a fourth square wave signal to obtain a fourth frequency-mixed signal;
   a fourth low-pass filter, configured to receive the fourth frequency-mixed signal from the fourth frequency mixer and perform low-pass filtering on the fourth frequency-mixed signal to obtain a fourth filtered signal; and
   a fourth analog-to-digital converter, configured to receive the fourth filtered signal from the fourth low-pass filter and perform analog-to-digital conversion on the fourth filtered signal to obtain a fourth sampled signal,
   wherein the processor is further configured to receive the third sampled signal from the third analog-to-digital converter, receive the fourth sampled signal from the fourth analog-to-digital converter, and estimate, according to the first sampled signal, the second sampled signal, the third sampled signal, and the fourth sampled signal, the information symbol transmitted by the transmit end; and
   wherein the third square wave signal and the fourth square wave signal are generated according to a carrier frequency estimation value of the second received signal, and the carrier frequency estimation value of the first received signal is different from the carrier frequency estimation value of the second received signal.

3. The receiver according to claim 2, wherein:
the third square wave signal is $\text{sign}(\sin(f_2 \times 2\pi \times t))$, and the fourth square wave signal is $\text{sign}(\cos(f_2 \times 2\pi \times t))$; or
the third square wave signal is $\text{sign}(\cos(f_2 \times 2\pi \times t))$, and the fourth square wave signal is $\text{sign}(\sin(f_2 \times 2\pi \times t))$,
wherein sign is a sign function, t represents a time, and $f_2$ is the carrier frequency estimation value of the second received signal.

4. The receiver according to claim 1, wherein:
the first square wave signal is $\text{sign}\{\sin(f_1 \times 2\pi \times t) + \sin((f_3+fp) \times 2\pi \times t)\}$, and the second square wave signal is $\text{sign}\{\cos(f_1 \times 2\pi \times t) + \cos((f_3+fp) \times 2\pi \times t)\}$; or
the first square wave signal is $\text{sign}\{\sin(f_1 \times 2\pi \times t) + \sin((f_3-fp) \times 2\pi \times t)\}$, and the second square wave signal is $\text{sign}\{\cos(f_1 \times 2\pi \times t) + \cos((f_3-fp) \times 2\pi \times t)\}$; or
the first square wave signal is $\text{sign}\{\sin((f_1+fp) \times 2\pi \times t) + \sin(f_3 \times 2\pi \times t)\}$, and the second square wave signal is $\text{sign}\{\cos((f_1+fp) \times 2\pi \times t) + \cos(f_3 \times 2\pi \times t)\}$; or
the first square wave signal is $\text{sign}\{\sin((f_1-fp) \times 2\pi \times t) + \sin(f_3 \times 2\pi \times t)\}$, and the second square wave signal is $\text{sign}\{\cos((f_1-fp) \times 2\pi \times t) + \cos(f_3 \times 2\pi \times t)\}$; or
the first square wave signal is $\text{sign}\{\sin(f_1 \times 2\pi \times t)\} + \text{sign}\{\sin((f_3+fp) \times 2\pi \times t)\}$, and the second square wave signal is $\text{sign}\{\cos(f_1 \times 2\pi \times t)\} + \text{sign}\{\cos((f_3+fp) \times 2\pi \times t)\}$; or
the first square wave signal is $\text{sign}\{\sin(f_1 \times 2\pi \times t)\} + \text{sign}\{\sin((f_3-fp) \times 2\pi \times t)\}$, and the second square wave signal is $\text{sign}\{\cos(f_1 \times 2\pi \times t)\} + \text{sign}\{\cos((f_3-fp) \times 2\pi \times t)\}$; or
the first square wave signal is $\text{sign}\{\sin((f_1+fp) \times 2\pi \times t)\} + \text{sign}\{\sin(f_3 \times 2\pi \times t)\}$, and the second square wave signal is $\text{sign}\{\cos((f_1+fp) \times 2\pi \times t\} + \text{sign}\{\cos(f_3 \times 2\pi \times t)\}$; or
the first square wave signal is $\text{sign}\{\sin((f_1-fp) \times 2\pi \times t)\} + \text{sign}\{\sin(f_3 \times 2\pi \times t)\}$, and the second square wave signal is $\text{sign}\{\cos((f_1-fp) \times 2\pi \times t)\} + \text{sign}\{\cos(f_3 \times 2\pi \times t)\}$; or
the first square wave signal is $\text{sign}\{\cos(f_1 \times 2\pi \times t) + \cos((f_3+fp) \times 2\pi \times t)\}$, and the second square wave signal is $\text{sign}\{\sin(f_1 \times 2\pi \times t) + \sin((f_3+fp) \times 2\pi \times t)\}$; or
the first square wave signal is $\text{sign}\{\cos(f_1 \times 2\pi \times t) + \cos((f_3-fp) \times 2\pi \times t)\}$, and the second square wave signal is $\text{sign}\{\sin(f_1 \times 2\pi \times t) + \sin((f_3-fp) \times 2\pi \times t)\}$; or
the first square wave signal is $\text{sign}\{\cos((f_1+fp) \times 2\pi \times t) + \cos(f_3 \times 2\pi \times t)\}$, and the second square wave signal is $\text{sign}\{\sin((f_1+fp) \times 2\pi \times t) + \sin(f_3 \times 2\pi \times t)\}$; or
the first square wave signal is $\text{sign}\{\cos((f_1-fp) \times 2\pi \times t) + \cos(f_3 \times 2\pi \times t)\}$, and the second square wave signal is $\text{sign}\{\sin((f_1-fp) \times 2\pi \times t) + \sin(f_3 \times 2\pi \times t)\}$; or
the first square wave signal is $\text{sign}\{\cos(f_1 \times 2\pi \times t)\} + \text{sign}\{\cos((f_3+fp) \times 2\pi \times t)\}$, and the second square wave signal is $\text{sign}\{\sin(f_1 \times 2\pi \times t)\} + \text{sign}\{\sin((f_3+fp) \times 2\pi \times t)\}$; or
the first square wave signal is $\text{sign}\{\cos(f_1 \times 2\pi \times t)\} + \text{sign}\{\cos((f_3-fp) \times 2\pi \times t)\}$, and the second square wave signal is $\text{sign}\{\sin(f_1 \times 2\pi \times t)\} + \text{sign}\{\sin((f_3-fp) \times 2\pi \times t)\}$; or
the first square wave signal is $\text{sign}\{\cos((f_1+fp) \times 2\pi \times t\} + \text{sign}\{\cos(f_3 \times 2\pi \times t)\}$, and the second square wave signal is $\text{sign}\{\sin((f_1+fp) \times 2\pi \times t)\} + \text{sign}\{\sin(f_3 \times 2\pi \times t)\}$; or
the first square wave signal is $\text{sign}\{\cos((f_1-fp) \times 2\pi \times t)\} + \text{sign}\{\cos(f_3 \times 2\pi \times t)\}$, and the second square wave signal is $\text{sign}\{\sin((f_1-fp) \times 2\pi \times t)\} + \text{sign}\{\sin(f_3 \times 2\pi \times t)\}$,
wherein sign is a sign function, t represents a time, fp is a minimum frequency or a fundamental frequency of the first square wave signal or the second square wave signal, $f_1$ and $f_3$ are the carrier frequency estimation values of the first received signal, and $f_1$ is not equal to $f_3$.

5. The receiver according to claim 1, wherein:
a bandwidth of the first low-pass filter and a bandwidth of the second low-pass filter range between (−fs/2, fs/2);
sampling rates of the first analog-to-digital converter and the second analog-to-digital converter are fs; and
fs=fp and fs>B,
wherein fp is a minimum frequency or a fundamental frequency of the first square wave signal or the second square wave signal, and B is a bandwidth of the first square wave signal or the second square wave signal.

6. The receiver according to claim 1, wherein:
a bandwidth of the first low-pass filter and a bandwidth of the second low-pass filter range between (−fs ×1.5, fs ×1.5);
sampling rates of the first analog-to-digital converter and the second analog-to-digital converter are 3×fs; and
fs =fp and fs >B,
wherein fp is a minimum frequency or a fundamental frequency of the first square wave signal or the second square wave signal, and B is a bandwidth of the first square wave signal or the second square wave signal.

7. A receiver, comprising:
a first frequency mixer, configured to perform frequency mixing on a first received signal by using a first square wave signal to obtain a first frequency-mixed signal, wherein the first square wave signal is based on a carrier frequency estimation value of the first received signal;
a first low-pass filter, configured to receive the first frequency-mixed signal from the first frequency mixer and perform low-pass filtering on the first frequency-mixed signal to obtain a first filtered signal;
a first analog-to-digital converter, configured to receive the first filtered signal from the first low-pass filter and perform analog-to-digital conversion on the first filtered signal to obtain a first sampled signal;
a second frequency mixer, configured to perform frequency mixing on the first received signal by using the first square wave signal to obtain a second frequency-mixed signal;
a second low-pass filter, configured to receive the second frequency-mixed signal from the second frequency mixer and perform low-pass filtering on the second frequency-mixed signal to obtain a second filtered signal;
a second analog-to-digital converter, configured to receive the second filtered signal from the second low-pass filter and perform analog-to-digital conversion on the second filtered signal to obtain a second sampled signal;
a third frequency mixer, configured to perform frequency mixing on the first received signal by using a second square wave signal to obtain a third frequency-mixed signal;
a third low-pass filter, configured to receive the third frequency-mixed signal from the third frequency mixer and perform low-pass filtering on the third frequency-mixed signal to obtain a third filtered signal; and
a third analog-to-digital converter, configured to receive the third filtered signal from the third low-pass filter and perform analog-to-digital conversion on the third filtered signal to obtain a third sampled signal;
a fourth frequency mixer, configured to perform frequency mixing on the first received signal by using the second square wave signal to obtain a fourth frequency-mixed signal;
a fourth low-pass filter, configured to receive the fourth frequency-mixed signal from the fourth frequency mixer and perform low-pass filtering on the fourth frequency-mixed signal to obtain a fourth filtered signal;

a fourth analog-to-digital converter, configured to receive the fourth filtered signal from the fourth low-pass filter and perform analog-to-digital conversion on the fourth filtered signal to obtain a fourth sampled signal; and a processor configured to receive the first sampled signal from the first analog-to-digital converter, the second sampled signal from the second analog-to-digital converter, receive the third sampled signal from the third analog-to-digital converter, and receive the fourth sampled signal from the fourth analog-to-digital converter, and estimate, according to the first sampled signal, the second sampled signal, the third sampled signal, and the fourth sampled signal, an information symbol transmitted by a transmit end.

8. The receiver according to claim 7, wherein the first received signal is a signal received by a radio frequency antenna.

9. The receiver according to claim 7, further comprising:
a filter, configured to perform filtering processing on a signal received by a radio frequency antenna, to obtain the first received signal.

10. The receiver according to claim 7, wherein the first square wave signal is generated by a digital device based on a first pseudo random sequence, and the first pseudo random sequence is generated according to the carrier frequency estimation value of the first received signal.

11. The receiver according to claim 10, wherein the first pseudo random sequence is obtained by performing quantization processing on one or more of a sine signal and a cosine signal that are based on the carrier frequency estimation value of the first received signal.

12. A signal processing method, comprising:
performing frequency mixing on a first received signal by using a first square wave signal to obtain a first frequency-mixed signal, wherein the first received signal comprises a narrowband signal whose carrier frequency is fi and wherein the first square wave signal is based on a carrier frequency estimation value of the first received signal;

performing low-pass filtering on the first frequency-mixed signal to obtain a first filtered signal;

performing analog-to-digital conversion on the first filtered signal to obtain a first sampled signal;

performing frequency mixing on the first received signal by using a second square wave signal to obtain a second frequency-mixed signal, wherein the second square wave signal is based on the carrier frequency estimation value of the first received signal;

performing low-pass filtering on the second frequency-mixed signal to obtain a second filtered signal;

performing analog-to-digital conversion on the second filtered signal to obtain a second sampled signal; and estimating, according to the first sampled signal and the second sampled signal, an information symbol transmitted by a transmit end, wherein:
the first square wave signal is sign{ sin($f_1$×2π×t)+sin(($f_3$+fp) ×2π×t)}, and the second square wave signal is sign{ cos($f_1$×2π×t)+cos(($f_3$+fp) ×2π×t)}; or the first square wave signal is sign{ sin($f_1$×2π×t)+sin(($f_3$−fp) ×2π×t)}, and the second square wave signal is sign{ cos($f_1$×2π×t) +cos(($f_3$−fp) ×2π×t)}; or the first square wave signal is sign{ sin(($f_1$+fp) ×2π×t) +sin($f_3$×2π×t)}, and the second square wave signal is sign{ cos(($f_1$+fp) ×2π×t) +cos($f_3$×2π×t)}; or the first square wave signal is sign{ sin(($f_1$−fp) ×2π×t)+ sin($f_3$×2π×t)}, and the second square wave signal is sign{ cos(($f_1$−fp) ×2π×t)+cos($f_3$×2π×t)}; or the first square wave signal is sign{ sin($f_1$×2π×t)}+sign {sin(($f_3$+fp) ×2π×t)}, and the second square wave signal is sign{ cos($f_1$×2π×t)}+sign{ cos(($f_3$+fp) ×2π×t)}; or the first square wave signal is sign{ sin($f_1$×2π×t)}+sign {sin(($f_3$−fp) ×2π×t)}, and the second square wave signal is sign{ cos($f_1$×2π×t)}+sign{ cos(($f_3$−fp) ×2π×t)}; or the first square wave signal is sign{ sin(($f_1$+fp) ×2π×t)}+ sign{ sin($f_3$×2π×t)}, and the second square wave signal is sign{ cos(($f_1$+fp) ×2π×t)} +sign{ cos($f_3$×2π×t)}; or the first square wave signal is sign{ sin(($f_1$−fp) ×2π×t)}+ sign{ sin($f_3$×2π×t)}, and the second square wave signal is sign{ cos(($f_1$−fp) ×2π×t)}+sign{ cos($f_3$×2π×t)}; or the first square wave signal is sign{ cos($f_1$×2π×t)}+cos(($f_3$+fp) ×2π×t)}, and the second square wave signal is sign{ sin($f_1$×2π×t)}+sin(($f_3$+fp) ×2π×t)}; or the first square wave signal is sign{ cos($f_1$×2π×t)}+cos(($f_3$−fp) ×2π×t)}, and the second square wave signal is sign{ sin($f_1$×2π×t) +sin(($f_3$−fp) ×2π×t)}; or the first square wave signal is sign{ cos(($f_1$+fp) ×2π xt)}+cos($f_3$×2π×t)}, and the second square wave signal is sign{ sin(($f_1$+fp) ×2π×t)}+sin($f_3$ ×2π×t)}; or the first square wave signal is sign{ cos(($f_1$−fp) ×2π xt)}+cos($f_3$×2π×t)}, and the second square wave signal is sign{ sin(($f_1$−fp) ×2π×t)}+sin($f_3$×2π×t)}; or the first square wave signal is sign{ cos($f_1$×2π×t)}+sign {cos(($f_3$+fp) ×2π×t)}, and the second square wave signal is sign{ sin($f_1$×2π×t)}+sign{ sin(($f_3$+fp) ×2π×t)}; or the first square wave signal is sign{ cos($f_1$×2π×t)}+sign {cos(($f_3$−fp) ×2π×t)}, and the second square wave signal is sign{ sin($f_1$×2π×t)}+sign{ sin(($f_3$−fp) ×2π xt)}; or the first square wave signal is sign{ cos(($f_1$+fp) ×2π xt)}+sign{ cos($f_3$×2π×t)}, and the second square wave signal is sign{ sin(($f_1$+fp) ×2π×t)}+sign{ sin($f_3$×2π xt)}; or the first square wave signal is sign{ cos(($f_1$−fp) ×2π xt)}+sign{ cos($f_3$×2π×t)}, and the second square wave signal is sign{ sin(($f_1$−fp) ×2π×t)}+sign{ sin($f_3$×2π xt)}, wherein sign is a sign function, t represents a time, fp is a minimum frequency or a fundamental frequency of the first square wave signal or the second square wave signal, $f_1$ and $f_3$ are the carrier frequency estimation values of the first received signal, and fi is not equal to $f_3$.

13. The signal processing method according to claim 12, further comprising:
performing frequency mixing on a second received signal by using a third square wave signal to obtain a third frequency-mixed signal;

performing low-pass filtering on the third frequency-mixed signal to obtain a third filtered signal;

performing analog-to-digital conversion on the third filtered signal to obtain a third sampled signal;

performing frequency mixing on the second received signal by using a fourth square wave signal to obtain a fourth frequency-mixed signal;

performing low-pass filtering on the fourth frequency-mixed signal to obtain a fourth filtered signal; and performing analog-to-digital conversion on the fourth filtered signal to obtain a fourth sampled signal, wherein the estimating, according to the first sampled signal and the second sampled signal, the information symbol transmitted by the transmit end comprises: estimating, according to the first sampled signal, the second sampled signal, the third sampled signal, and the fourth sampled signal, the information symbol transmitted by the transmit end; and wherein the third square wave signal and the fourth square wave signal are generated according to a carrier frequency estimation value of the second received signal, and the carrier frequency estimation value of the first received signal is different from the carrier frequency estimation value of the second received signal.

14. The signal processing method according to claim 13, wherein:

the third square wave signal is sign(sin($f_2 \times 2\pi \times t$)), and the fourth square wave signal is sign(cos($f_2 \times 2\pi \times t$)); or the third square wave signal is sign(cos($f_2 \times 2\pi \times t$)), and the fourth square wave signal is sign(sin($f_2 \times 2\pi \times t$)), wherein sign is a sign function, t represents a time, and $f_2$ is the carrier frequency estimation value of the second received signal.

15. The signal processing method according to claim 12, wherein:

the first square wave signal is sign(sin($f_1 \times 2\pi \times t$)), and the second square wave signal is sign(cos($f_1 \times 2\pi \times t$)); or the first square wave signal is sign(cos($f_1 \times 2\pi \times t$)), and the second square wave signal is sign(sin($f_1 \times 2\pi \times t$)), wherein sign is a sign function, t represents a time, and fi is the carrier frequency estimation value of the first received signal.

16. The signal processing method according to claim 12, further comprising:

performing frequency mixing on the first received signal by using the first square wave signal to obtain a fifth frequency-mixed signal;

performing low-pass filtering on the fifth frequency-mixed signal to obtain a fifth filtered signal;

performing analog-to-digital conversion on the fifth filtered signal to obtain a fifth sampled signal;

performing frequency mixing on the first received signal by using the second square wave signal to obtain a sixth frequency-mixed signal;

performing low-pass filtering on the sixth frequency-mixed signal to obtain a sixth filtered signal; and performing analog-to-digital conversion on the sixth filtered signal to obtain a sixth sampled signal, wherein the estimating, according to the first sampled signal and the second sampled signal, the information symbol transmitted by the transmit end comprises: estimating, according to the first sampled signal, the second sampled signal, the fifth sampled signal, and the sixth sampled signal, the information symbol transmitted by the transmit end.

17. The signal processing method according to claim 12, wherein the first square wave signal is generated by a digital device based on a first pseudo random sequence, and the first pseudo random sequence is generated according to the carrier frequency estimation value of the first received signal.

18. The signal processing method according to claim 17, wherein the first pseudo random sequence is obtained by the digital device by performing quantization processing on one or more of a sine signal and a cosine signal that are based on the carrier frequency estimation value of the first received signal.

* * * * *